US010224769B2

(12) United States Patent
Yamagishi

(10) Patent No.: US 10,224,769 B2
(45) Date of Patent: *Mar. 5, 2019

(54) SOLID-STATE IMAGING DEVICE, METHOD OF MANUFACTURING SOLID-STATE IMAGING DEVICE, AND ELECTRONIC APPARATUS

(71) Applicant: SONY CORPORATION, Tokyo (JP)

(72) Inventor: Hajime Yamagishi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/625,085

(22) Filed: Jun. 16, 2017

(65) Prior Publication Data

US 2017/0288481 A1    Oct. 5, 2017

Related U.S. Application Data

(63) Continuation of application No. 15/032,142, filed on Apr. 26, 2016, now Pat. No. 9,685,480.

(51) Int. Cl.
*H01L 31/00* (2006.01)
*H02K 1/27* (2006.01)
(Continued)

(52) U.S. Cl.
CPC ......... *H02K 1/27* (2013.01); *H01L 21/76898* (2013.01); *H01L 23/481* (2013.01);
(Continued)

(58) Field of Classification Search
CPC ......... H01L 27/14636; H01L 27/14689; H01L 27/14643; H01L 23/481; H01L 27/3276
(Continued)

(56) References Cited

U.S. PATENT DOCUMENTS 9,685,480 B2 *    6/2017   Yamagishi .......... H01L 27/1469

FOREIGN PATENT DOCUMENTS

JP    2006-123014 A    5/2006
JP    2006-134221 A    5/2006

OTHER PUBLICATIONS

International Search Report and Written Opinion of PCT Application No. PCT/JP2015/080767, dated Dec. 28, 2015, 1 page of English Translation and 7 pages of ISRWO.

* cited by examiner

*Primary Examiner* — Theresa T Doan
(74) *Attorney, Agent, or Firm* — Chip Law Group

(57) ABSTRACT

The present technology relates to a solid-state imaging device that can reduce the number of steps and enhance mechanical strength, a method of manufacturing the solid-state imaging device, and an electronic apparatus. The solid-state imaging device includes a laminate including a first semiconductor substrate having a pixel region and at least one second semiconductor substrate having a logic circuit, the at least one second semiconductor substrate being bonded to the first semiconductor substrate such that the first semiconductor substrate becomes an uppermost layer, and a penetration connecting portion that penetrates from the first semiconductor substrate into the second semiconductor substrate and connects a first wiring layer formed in the first semiconductor substrate to a second wiring layer formed in the second semiconductor substrate. The first wiring layer is formed with Al or Cu. The present technology is applicable, for example, to a back-surface irradiation type CMOS image sensor.

13 Claims, 27 Drawing Sheets

(51) Int. Cl.
  *H01L 27/146*   (2006.01)
  *H01L 21/768*   (2006.01)
  *H01L 23/48*    (2006.01)
  *H04N 5/374*    (2011.01)
  *H02K 1/32*     (2006.01)
  *H04N 5/335*    (2011.01)
  *H02K 7/18*     (2006.01)

(52) U.S. Cl.
  CPC ...... *H01L 27/1464* (2013.01); *H01L 27/1469* (2013.01); *H01L 27/14634* (2013.01); *H01L 27/14636* (2013.01); *H01L 27/14643* (2013.01); *H01L 27/14689* (2013.01); *H02K 1/2766* (2013.01); *H02K 1/32* (2013.01); *H04N 5/374* (2013.01); *H01L 27/14627* (2013.01); *H01L 27/14641* (2013.01); *H01L 2924/0002* (2013.01); *H02K 7/1838* (2013.01); *H02K 2213/12* (2013.01); *H04N 5/335* (2013.01); *Y02E 10/725* (2013.01)

(58) Field of Classification Search
  USPC ........................................................ 257/448
  See application file for complete search history.

FIG. 18

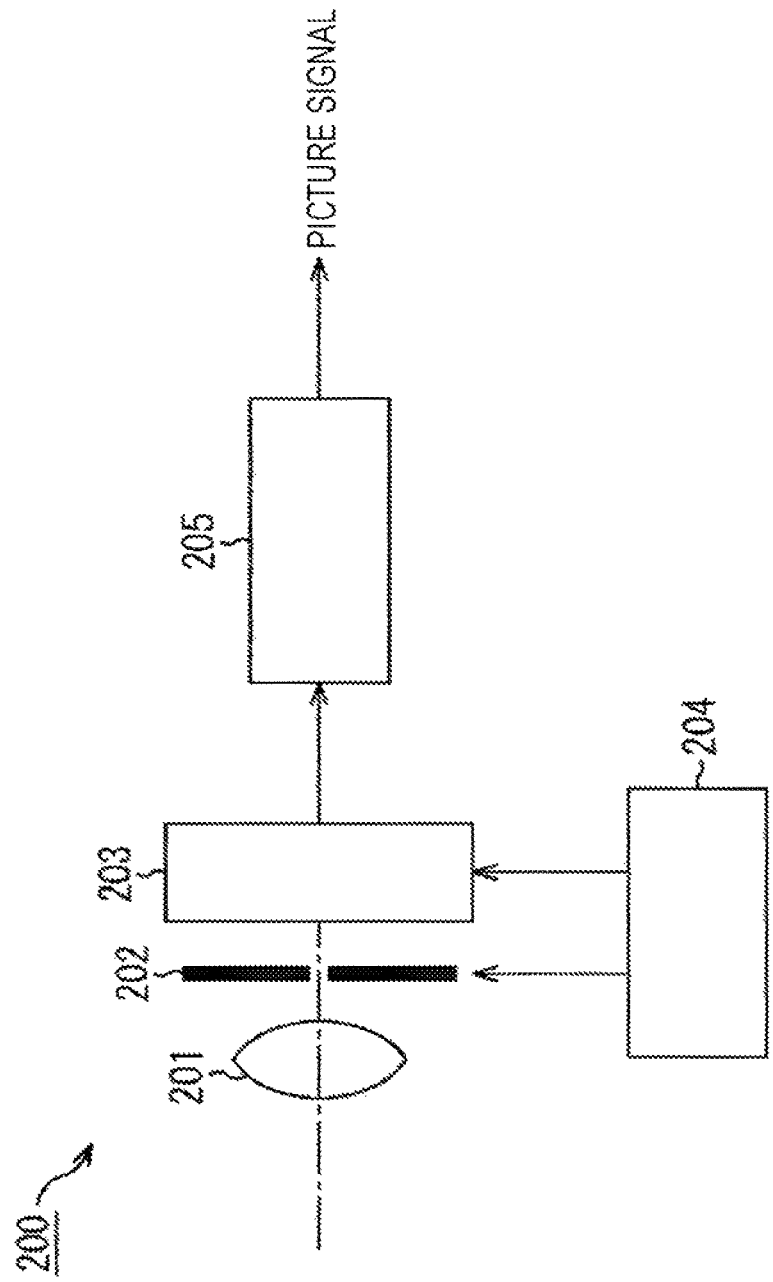

SOLID-STATE IMAGING DEVICE, METHOD OF MANUFACTURING SOLID-STATE IMAGING DEVICE, AND ELECTRONIC APPARATUS

CROSS REFERENCE TO RELATED APPLICATIONS

The present application is a continuation application of U.S. patent application Ser. No. 15/032,142, filed Apr. 26, 2016, which is a National Stage of PCT/JP2014/078306, filed Oct. 24, 2014, and claims the priority from prior Japanese Priority Patent Application JP 2013-230271 filed in the Japan Patent Office on Nov. 6, 2013. Each of the above-referenced applications is hereby incorporated herein by reference in its entirety.

TECHNICAL FIELD

The present technology relates to a solid-state imaging device, a method of manufacturing the solid-state imaging device, and an electronic apparatus, and particularly relates to a solid-state imaging device that can reduce the number of steps and enhance mechanical strength, a method of manufacturing the solid-state imaging device, and an electronic apparatus.

BACKGROUND ART

There has been conventionally known a back-surface irradiation type solid-state imaging device that receives light on the surface opposite the surface on which a wiring layer is formed. In the solid-state imaging device having this structure, light enters a light receiving portion without being blocked by the wiring layer, thereby enabling drastic enhancement of sensitivity.

In recent years, there has been also proposed, as a back-surface irradiation type solid-state imaging device, a laminated-type complementary metal oxide semiconductor (CMOS) image sensor including: a first semiconductor substrate having a pixel region; and a second semiconductor substrate having a logic circuit bonded to the first semiconductor substrate (for example, see Patent Literature 1).

CITATION LIST

Patent Literature

Patent Literature 1: JP 2011-96851A

SUMMARY OF INVENTION

Technical Problem

The solid-state imaging device of Patent Literature 1 includes an opening that penetrates from the first semiconductor substrate into the second semiconductor substrate and exposes an Al wiring formed in a wiring layer of the second semiconductor substrate. The Al wiring exposed in this manner is used as an electrode pad for connecting with exterior wirings.

In such a structure, planarization by embedding of an Al wiring needs to be sufficiently performed after the Al wiring was formed in the second semiconductor substrate in order to connect the first semiconductor substrate and the second semiconductor substrate.

However, since the Al wiring needs to have strength to bumps and bonding, the Al wiring needs to have a film thickness of 400 nm or more (preferably 500 nm or more). In this case, for sufficient planarization by embedding of the Al wiring, an insulating film having a film thickness that is 1.5 times the film thickness of the Al wiring needs to be formed. Accordingly, the amount of planarization by chemical mechanical polishing (CMP) to be performed increases. In this manner, when forming the Al wiring, instead of a Cu wiring, on the connecting surface of the second semiconductor substrate, the number of steps tended to increase.

In addition, a low-dielectric constant film (Low-k film) is used for suppressing the dielectric constant between wiring lines in the wiring layer of the second semiconductor substrate. However, the Low-k film is a material having low Young's modulus. Therefore, when a layer of the Al wiring is formed on the Low-k film, the Low-k film cannot withstand mechanical stress caused by bumps and bonding, possibly causing cracks, peeling, and the like in the wiring layer.

Furthermore, the opening of the electrode pad penetrates a Si substrate of the first semiconductor substrate. When the Si substrate is brought into contact with the material of bumps or bonding, there has been the possibility of an electric short between the electrode pads. To address this concern, an insulating spacer layer needs to be disposed near the opening in the Si substrate of the first semiconductor substrate. This has been also a factor of the increased number of steps.

The present technology has been achieved in view of such circumstances, and is intended to reduce the number of steps and enhance mechanical strength.

Solution to Problem

A solid-state imaging device according to an aspect of the present technology includes: a laminate including a first semiconductor substrate having a pixel region and at least one second semiconductor substrate having a logic circuit, the at least one second semiconductor substrate being bonded to the first semiconductor substrate such that the first semiconductor substrate becomes an uppermost layer; and a penetration connecting portion that penetrates from the first semiconductor substrate into the second semiconductor substrate and connects a first wiring layer formed in the first semiconductor substrate to a second wiring layer formed in the second semiconductor substrate. The first wiring layer is formed with Al or Cu.

The first semiconductor substrate can be bonded to the second semiconductor substrate with a back surface of the first semiconductor substrate upward. The first wiring layer can be embedded on the back surface side of the first semiconductor substrate.

An opening can be further provided, the opening being formed such that a top surface of the first wiring layer is exposed. The first wiring layer including the exposed top surface can constitute an electrode pad.

The first wiring layer and the second wiring layer can be connected through a plurality of penetration connecting portions.

The opening can be formed outside a pixel region in the first semiconductor substrate.

A connecting portion that connects the first wiring layer to a third wiring layer formed in a layer below the first wiring layer can be further provided in the first semiconductor substrate. The connecting portion, the first wiring layer, and the penetration connecting portion can constitute an inter-substrate wiring that electrically connects the first semiconductor substrate and the second semiconductor substrate.

A method of manufacturing a solid-state imaging device according to an aspect of the present technology includes the steps of: bonding a first semiconductor substrate having a pixel region to at least one second semiconductor substrate having a logic circuit such that the first semiconductor substrate becomes an uppermost layer; forming a penetration connecting portion that penetrates from the first semiconductor substrate into the second semiconductor substrate and is connected to a second wiring layer formed in the second semiconductor substrate; and forming a first wiring layer with Al or Cu in the first semiconductor substrate, the first wiring layer being connected to the penetration connecting portion.

An electronic apparatus according to an aspect of the present technology includes: a solid-state imaging device including a laminate including a first semiconductor substrate having a pixel region and at least one second semiconductor substrate having a logic circuit, the at least one second semiconductor substrate being bonded to the first semiconductor substrate such that the first semiconductor substrate becomes an uppermost layer, and a penetration connecting portion that penetrates from the first semiconductor substrate into the second semiconductor substrate and connects a first wiring layer formed in the first semiconductor substrate to a second wiring layer formed in the second semiconductor substrate. The first wiring layer is formed with Al or Cu.

In an aspect of the present technology, a first semiconductor substrate having a pixel region and at least one second semiconductor substrate having a logic circuit are bonded together such that the first semiconductor substrate becomes the uppermost layer. Furthermore, a first wiring layer formed in the first semiconductor substrate is connected to a second wiring layer formed in the second semiconductor substrate through a penetration connecting portion that penetrates from the first semiconductor substrate into the second semiconductor substrate. The first wiring layer is formed with Al or Cu.

Advantageous Effects of Invention

According to an aspect of the present technology, the number of steps can be reduced, and mechanical strength can be enhanced.

BRIEF DESCRIPTION OF DRAWINGS

FIG. 18 is a diagram illustrating manufacturing steps of a solid-state imaging device.

FIG. 27 is a block diagram illustrating a configuration example of an electronic apparatus according to an embodiment of the present technology.

DESCRIPTION OF EMBODIMENT(S)

Hereinafter, embodiments of the present technology will be described with reference to the drawings.

<Configuration of Solid-State Imaging Device>

Figure 1:
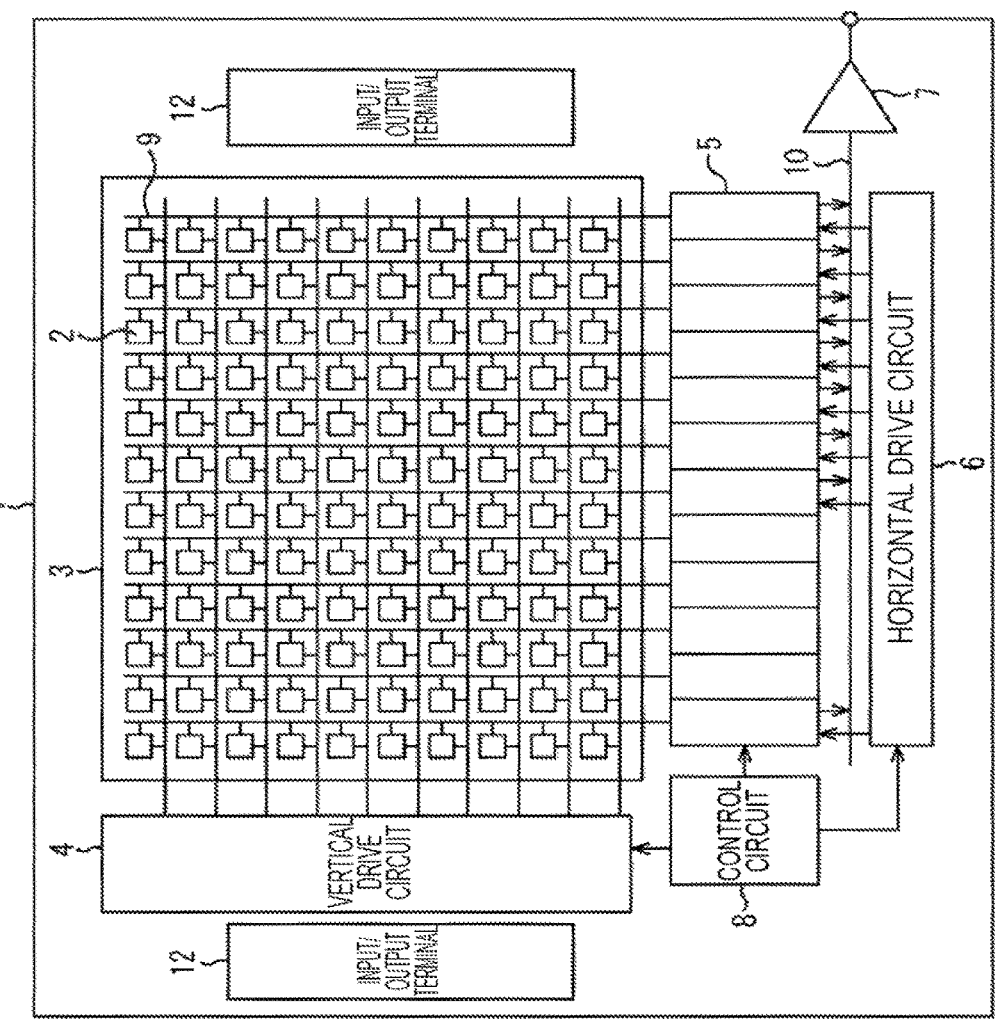
FIG. 1 is a block diagram illustrating a configuration example of a solid-state imaging device according to an embodiment of the present technology.

FIG. 1 is a block diagram illustrating a configuration example of a solid-state imaging device according to an embodiment of the present technology.

A solid-state imaging device 1 is configured as a complementary metal oxide semiconductor (CMOS) image sensor, and includes an unillustrated semiconductor substrate (for example, a Si substrate) having a pixel region (pixel array) 3 where a plurality of pixels 2 are regularly arranged in a two-dimensional array state and a peripheral circuit portion.

The pixel 2 has a photoelectric conversion portion (for example, a photodiode) and a plurality of pixel transistors (MOS transistors). The plurality of pixel transistors may be constituted by, for example, three transistors of a transfer transistor, a reset transistor, and an amplification transistor. Alternatively, a selection transistor may be added so that the pixel transistors are constituted by four transistors. It is noted that an equivalent circuit of a unit pixel is similar to a known one, and therefore detailed description thereof is omitted.

The pixel 2 may be configured as one unit pixel, or may be configured to have a shared pixel structure. This pixel shared structure is a structure in which a plurality of photodiodes shares floating diffusion and transistors other than the transfer transistor.

The peripheral circuit portion includes a vertical drive circuit 4, a column signal processing circuit 5, a horizontal drive circuit 6, an output circuit 7, and a control circuit 8.

The control circuit 8 receives an input clock and a data that designates an action mode and the like, and outputs data such as internal information of the solid-state imaging device 1. The control circuit 8 also generates a clock signal and a control signal which serve as criteria for the actions of the vertical drive circuit 4, the column signal processing circuit 5, the horizontal drive circuit 6, and the like, based on a vertical synchronization signal, a horizontal synchronization signal, and a master clock, and inputs these signals to the vertical drive circuit 4, the column signal processing circuit 5, the horizontal drive circuit 6, and the like.

The vertical drive circuit 4 is constituted by, for example, a shift resistor, selects a pixel drive wiring, supplies the selected pixel drive wiring with a pulse for driving a pixel, and drives pixels row by row. That is, the vertical drive circuit 4 sequentially selects and scans the pixels 2 of the pixel region 3 row by row in the vertical direction, and supplies the column signal processing circuit 5 with a pixel signal based on a signal charge generated according to the amount of received light in the photoelectric conversion portion of each pixel 2 through a vertical signal line 9.

The column signal processing circuit 5 is disposed, for example, for each column of the pixels 2, and performs signal processing such as noise removal to signals output from one row of the pixels 2 for each pixel column. Specifically, the column signal processing circuit 5 performs signal processing such as correlated double sampling (CDS) for removing a specific pattern noise specific to the pixel 2, signal amplification, and analog/digital (A/D) conversion. In an output stage of the column signal processing circuit 5, a horizontal selection switch (not illustrated) is connected between the column signal processing circuit 5 and a horizontal signal line 10.

The horizontal drive circuit 6 is constituted by, for example, a shift resistor, sequentially outputs a horizontal scanning pulse to select each of the column signal processing circuits 5 in order, and outputs a pixel signal from each of the column signal processing circuits 5 to the horizontal signal line 10.

The output circuit 7 processes a signal sequentially supplied from each of the column signal processing circuits 5 through the horizontal signal line 10, and outputs the processed signal. The output circuit 7 may perform only buffering, or may perform black level adjustment, column variation correction, various types of digital signal processing, and the like.

An input and output terminal 12 externally exchanges a signal.

<Structure of Solid-State Imaging Device>

Next, a structure of a solid-state imaging device according to the present technology will be described.

Figure 2:
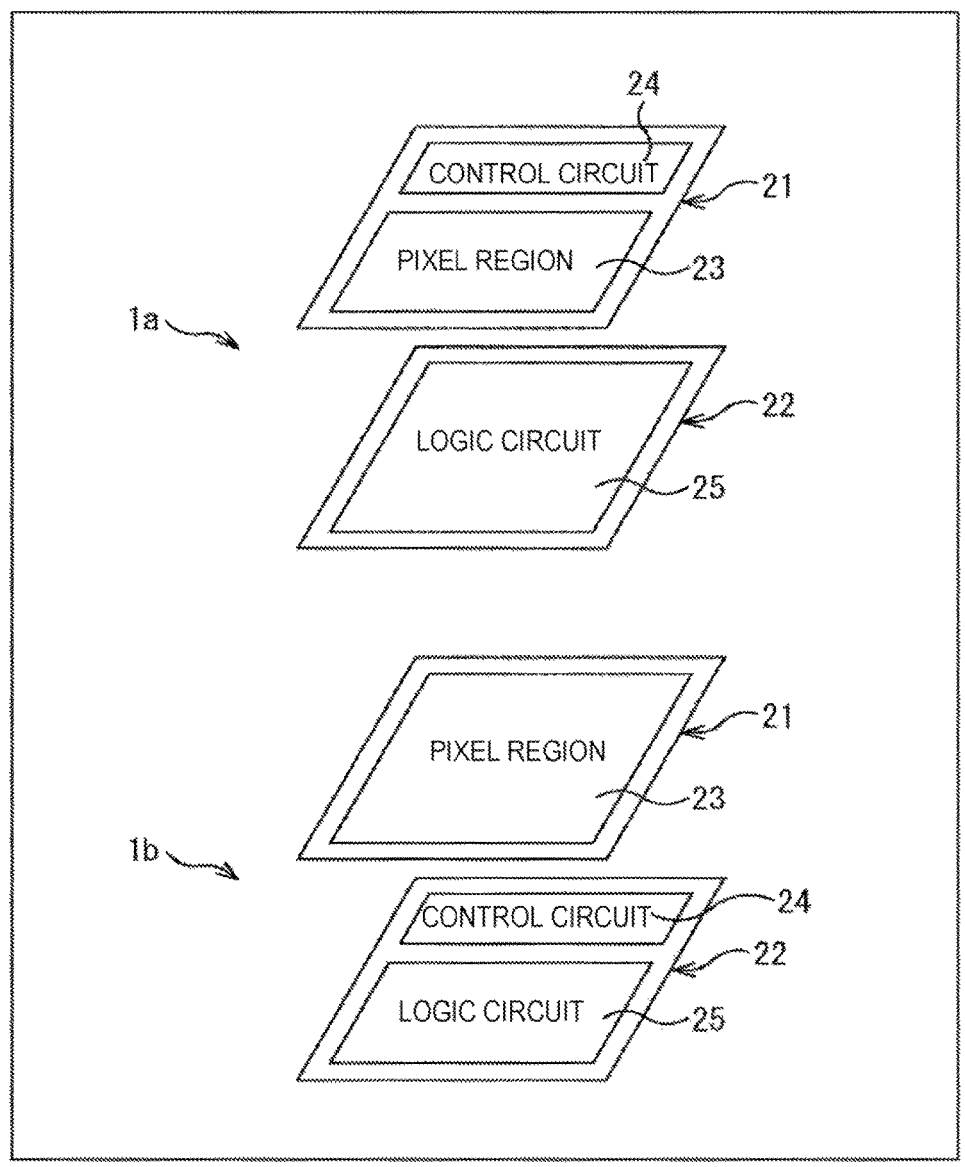
FIG. 2 is a diagram for explaining a structure of a solid-state imaging device.

As a first example, a solid-state imaging device 1a illustrated in the upper portion of FIG. 2 includes a first semiconductor substrate 21 and a second semiconductor substrate 22. The first semiconductor substrate 21 has a pixel region 23 and a control circuit 24, and the second semiconductor substrate 22 has a logic circuit 25 containing a signal processing circuit. The first semiconductor substrate 21 and the second semiconductor substrate 22 are electrically connected with each other to constitute the solid-state imaging device 1a as a semiconductor chip.

As a second example, a solid-state imaging device 1b illustrated in the lower portion of FIG. 2 includes a first semiconductor substrate 21 and a second semiconductor substrate 22. The first semiconductor substrate 21 has a pixel region 23, and the second semiconductor substrate 22 has a control circuit 24 and a logic circuit 25 containing a signal processing circuit. The first semiconductor substrate 21 and the second semiconductor substrate 22 are electrically connected with each other to constitute the solid-state imaging device 1b as a semiconductor chip.

<Cross-Sectional Diagram of Solid-State Imaging Device>

Figure 3:
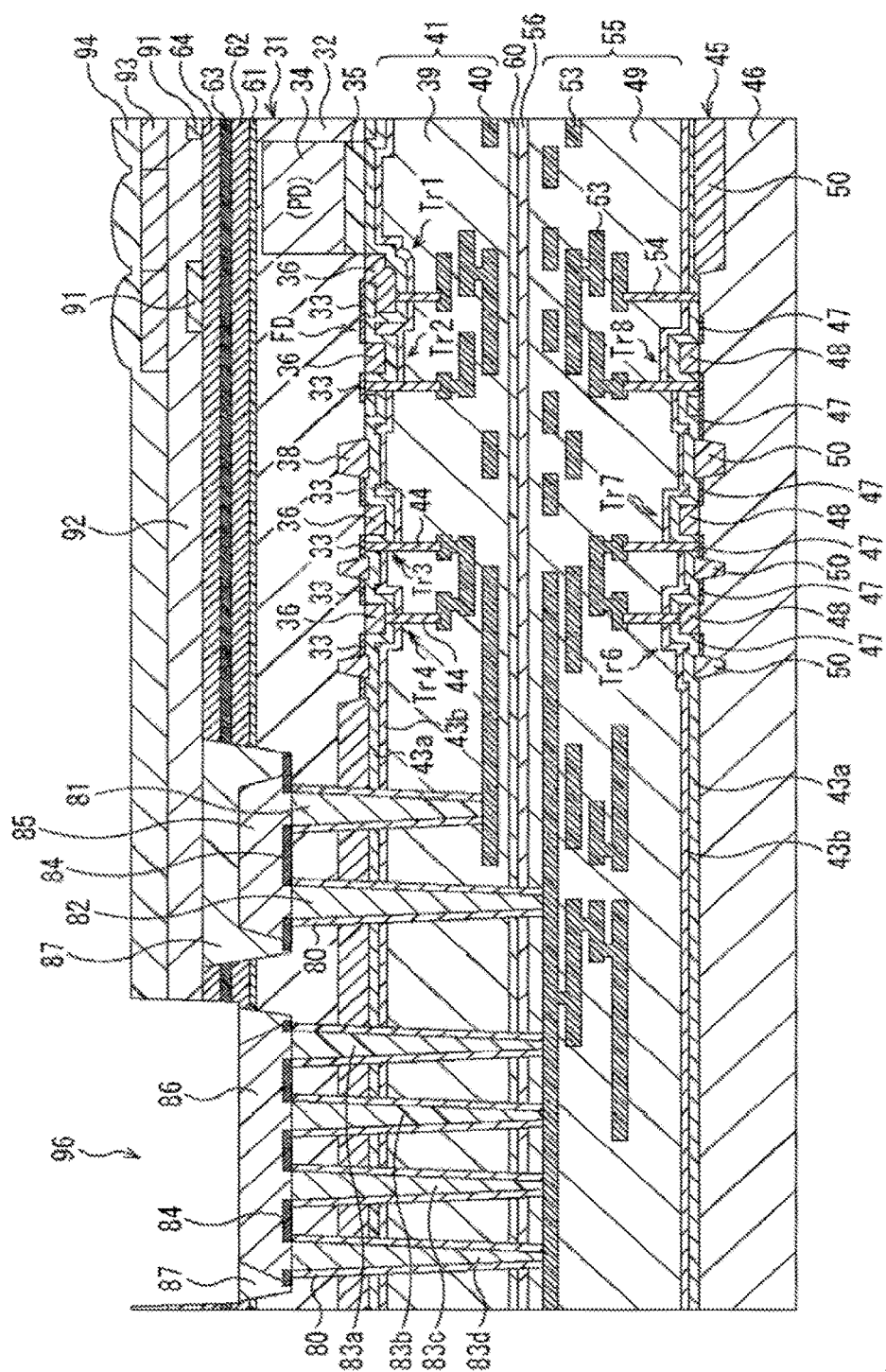
FIG. 3 is a cross-sectional diagram illustrating a configuration example of a solid-state imaging device.

FIG. 3 is a cross-sectional diagram of a solid-state imaging device 1.

Although a detailed description will be provided later, the solid-state imaging device 1 according to the present embodiment illustrated in FIG. 3 is, similarly to the solid-state imaging device 1a in FIG. 2, configured as a laminated body in which a first semiconductor wafer 31 having a pixel region and a second semiconductor wafer 45 having a logic circuit are bonded together such that the first semiconductor wafer 31 becomes an upper layer.

The first semiconductor wafer 31 is bonded to the second semiconductor wafer 45 with the back surface of the first semiconductor wafer 31 upward. That is, the solid-state imaging device 1 is a laminated, back-surface irradiation type solid-state imaging device.

A multilayer wiring layer 41 containing a plurality of Cu wirings 40 is formed on the frond surface side (the lower side in the drawing) of the first semiconductor wafer 31, and a multilayer wiring layer 55 containing a plurality of Cu wirings 53 is formed on the front surface side (the upper side in the drawing) of the second semiconductor wafer 45.

When the whole multilayer wiring layer 55 of the second semiconductor wafer 45 is formed with the Cu wirings in this manner, a connecting surface to the first semiconductor wafer 31 can be planarized.

In the first semiconductor wafer 31 constituted by a Si substrate, Al wirings 85 and 86 are formed in such a manner as to be embedded on the back surface side (the upper side in the drawing) of the first semiconductor wafer 31.

When the Al wirings 85 and 86 are embedded in the first semiconductor wafer 31 constituted by a Si substrate in this manner, there can be obtained a substantially flattened pixel surface. Therefore, sweeping unevenness in applying a material of an on-chip color filter 93 or the like can be suppressed.

It is noted that the first semiconductor wafer 31 and the Al wiring 85 and 86 embedded in the first semiconductor wafer 31 are configured to be insulated from each other by an the insulating film 84.

Furthermore, the solid-state imaging device 1 includes a plurality of penetration connecting portions 82, 83a, 83b, 83c, and 83d that penetrate from the first semiconductor wafer 31 into the second semiconductor wafer 45 to connect the Al wirings 85 and 86 of the first semiconductor wafer 31 to the Cu wirings 53 of the second semiconductor wafer 45.

In the solid-state imaging device 1, the Al wiring 85 constitutes an inter-substrate wiring that electrically connects the first semiconductor wafer 31 to the second semiconductor wafer 45, together with the penetration connecting portion 82, and a connecting portion 81 that connects the Al wiring 85 to the Cu wiring 40.

The first semiconductor wafer 31 also includes an opening 96 such that the top surface of the Al wiring 86 is exposed. In the solid-state imaging device 1, the Al wiring 86 having the exposed top surface constitutes an electrode pad for connecting to exterior wirings. It is noted that the opening 96 and the Al wiring 86 are formed outside the pixel region in the first semiconductor wafer 31.

According to the above-described configuration, in comparison to the conventional structure in which an Al wiring is formed in the wiring layer of the second semiconductor substrate, planarization by embedding of the Al wiring does not need to be sufficiently performed. Thus, the number of steps can be reduced.

Furthermore, since a Si substrate, instead of a wiring layer constituted by a Low-k film, is formed in the layer below the Al wiring in the first semiconductor wafer, resistance to a mechanical stress caused by bumps and bonding increases, and mechanical strength below the electrode pad can be enhanced.

The Al wirings formed in the first semiconductor substrate are formed in such a manner as to be embedded in the Si substrate. Since the Al wirings and the Si substrate are insulated from each other by the insulating film, an insulating spacer layer does not need to be disposed near the opening in the Si substrate of the first semiconductor substrate. Thus, the number of steps can be further reduced.

<Method of Manufacturing Solid-State Imaging Device>

Figure 4:
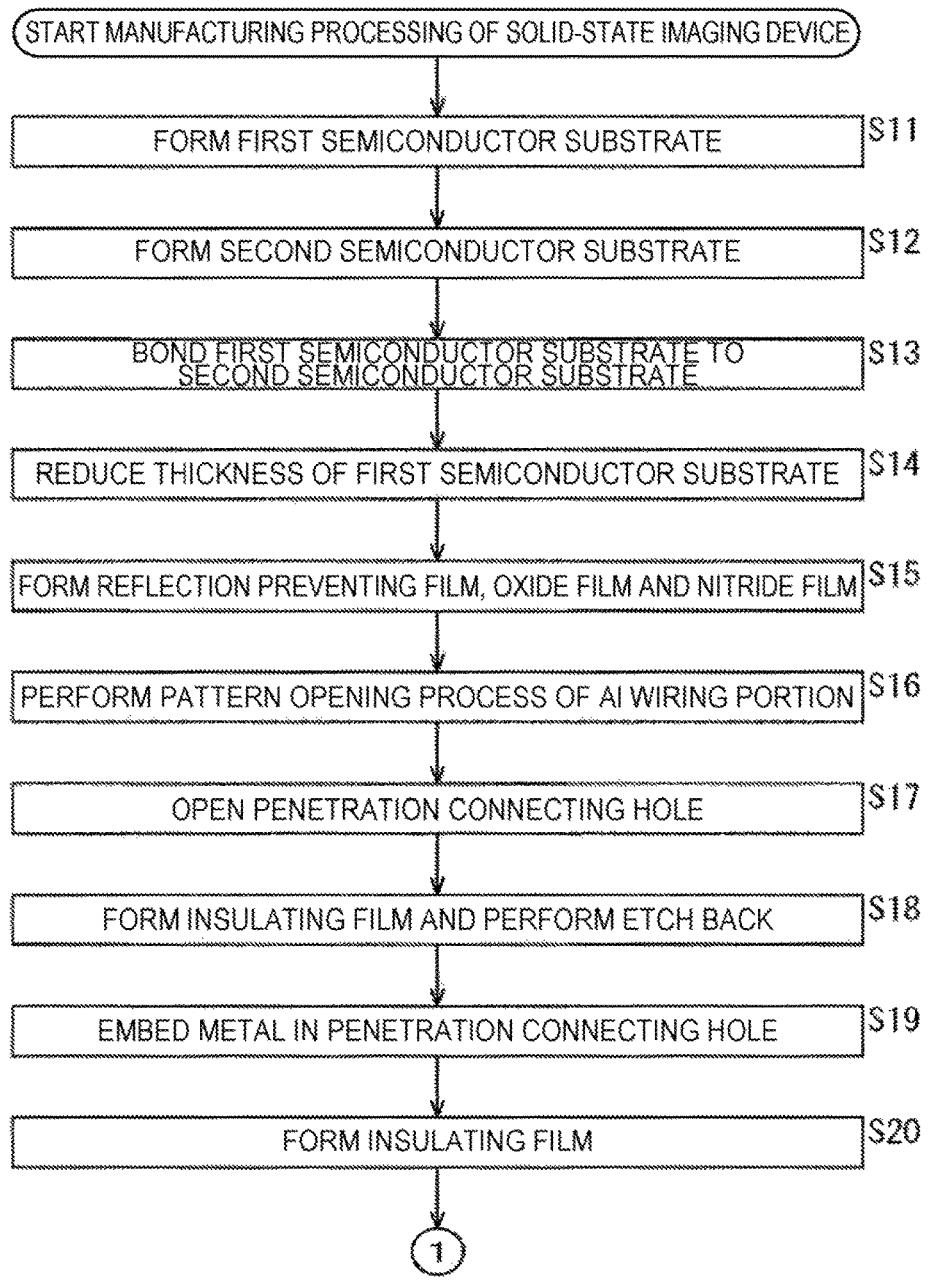
FIG. 4 is a flow chart for explaining manufacturing processing of a solid-state imaging device.
Figure 5:
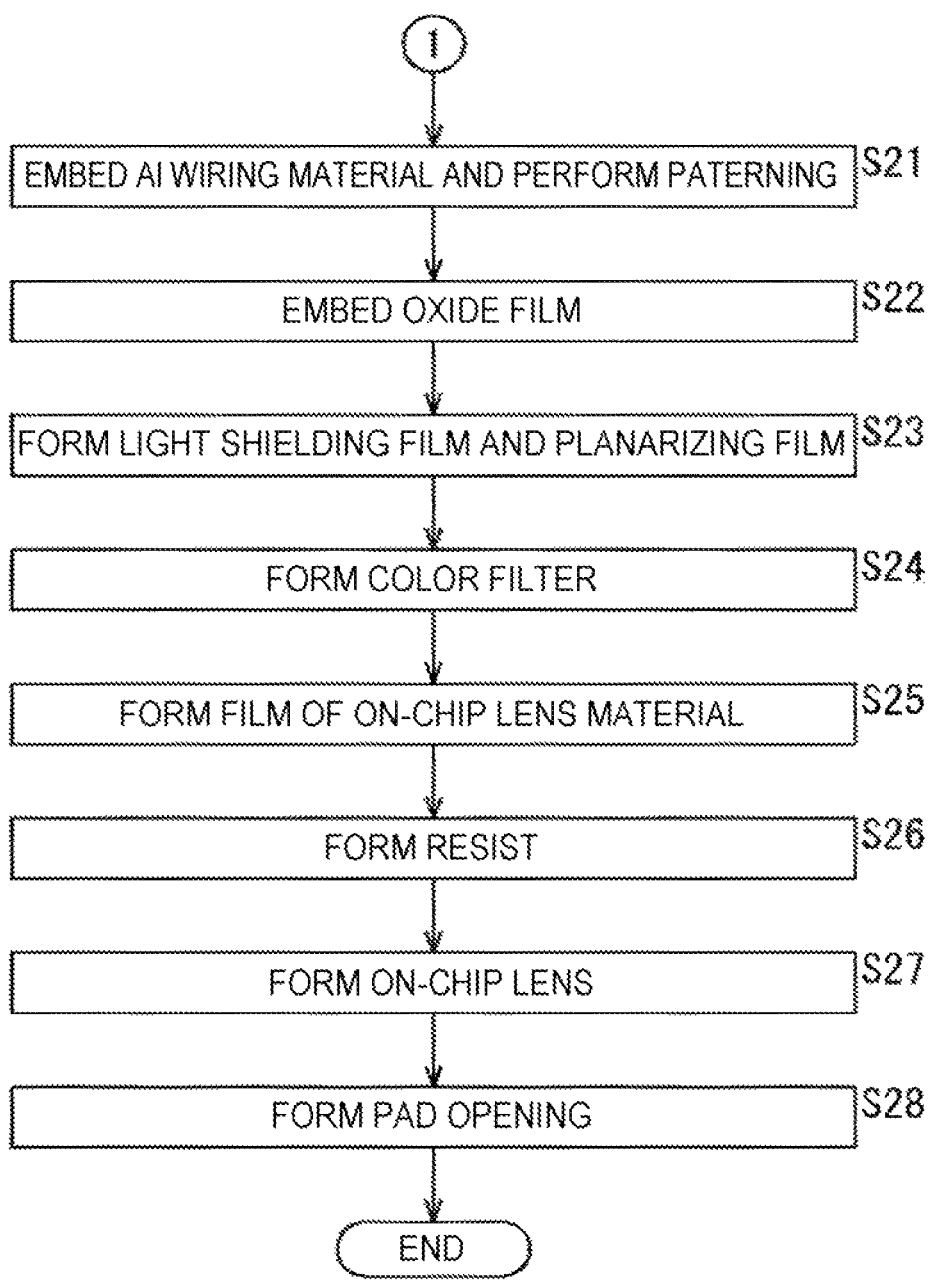
FIG. 5 is a flow chart for explaining manufacturing processing of a solid-state imaging device.

Next, a method of manufacturing a solid-state imaging device 1 according to the present embodiment will be described using FIG. 4 to FIG. 26. FIG. 4 and FIG. 5 are each a flow chart explaining the manufacturing processing of the solid-state imaging device 1, and FIG. 6 to FIG. 26 are each a diagram explaining a manufacturing step of the solid-state imaging device 1.

First, in step S11, a first semiconductor substrate is formed.

Figure 6:
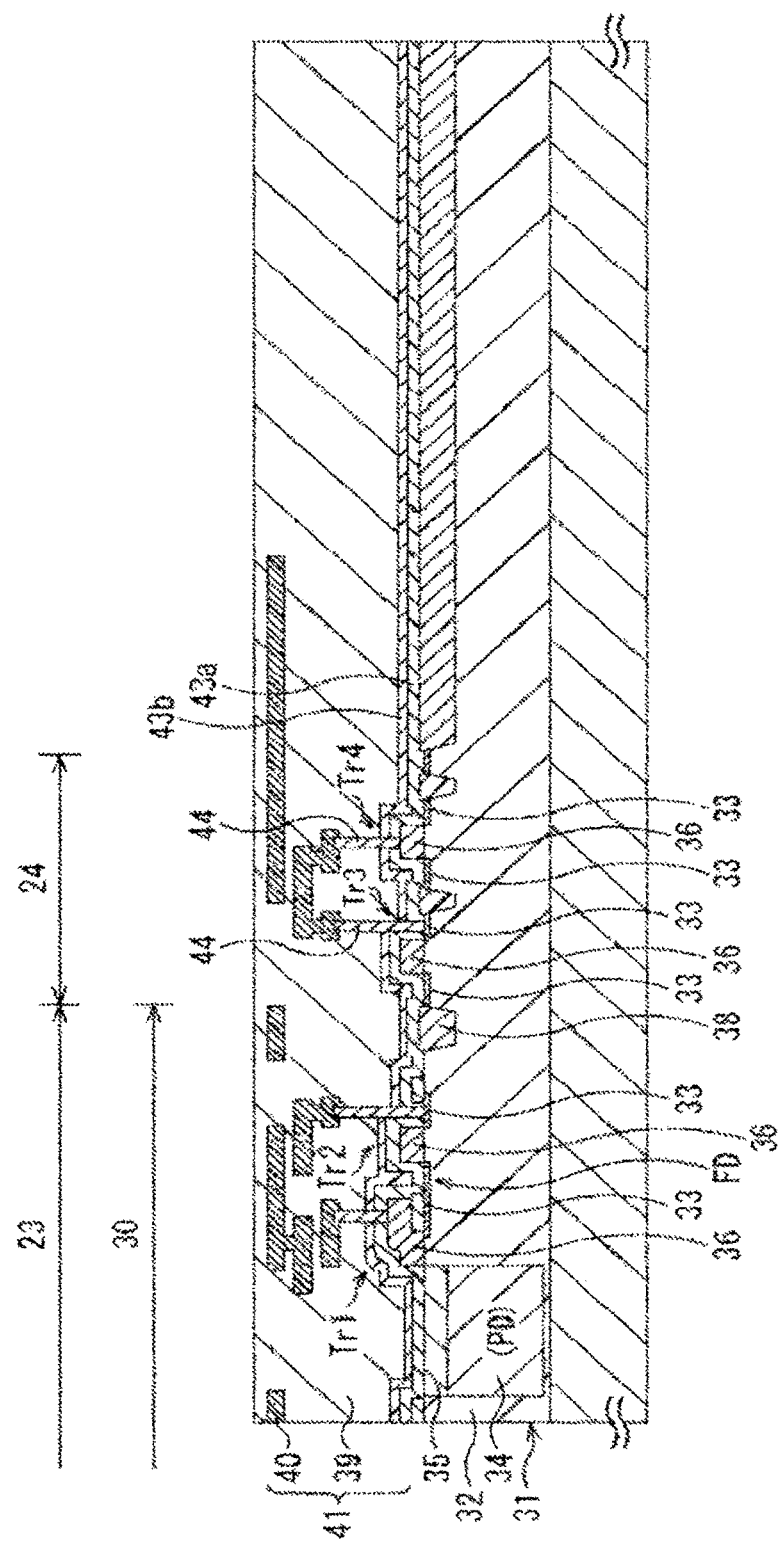
FIG. 6 is a diagram illustrating manufacturing steps of a solid-state imaging device.

Specifically, as illustrated in FIG. 6, an image sensor, that is, a pixel region 23 and a control circuit 24, in the state of a semi-finished product is firstly formed in a region that becomes a chip portion of a first semiconductor wafer (hereinafter, referred to as a first semiconductor substrate) 31. In brief, a photodiode (PD) that becomes a photoelectric conversion portion for each pixel is formed in a region that becomes a chip portion of the first semiconductor substrate 31 constituted by a Si substrate. Furthermore, in a semiconductor well region 32 thereof, a source and drain region 33 for each pixel transistor is formed. The semiconductor well region 32 is formed by introducing a first conductive-type, for example, p-type impurities. The source and drain region 33 is formed by introducing a second conductive-type, for example, n-type impurities. The photodiode (PD) and the source and drain region 33 for each pixel transistor are formed by ion implantation from the substrate surface.

The photodiode (PD) has an n-type semiconductor region 34 and a p-type semiconductor region 35 on the substrate surface side. A gate electrode 36 is formed via a gate insulating film on the substrate surface constituting a pixel, and pixel transistors Tr1 and Tr2 are each formed by the gate electrode 36 and a source and drain region 33 paired with the gate electrode 36. In FIG. 6, a plurality of pixel transistors is represented by two pixel transistors Tr1 and Tr2. The pixel transistor Tr1 neighboring the photodiode (PD) corresponds to a transfer transistor, and a source and drain region thereof corresponds to a floating diffusion (FD). Each unit pixel 30 is isolated by an element isolating region 38.

On the other hand, on the control circuit 24 side, a MOS transistor constituting a control circuit is formed in the first semiconductor substrate 31. In FIG. 6, a MOS transistor constituting the control circuit 24 is represented by MOS transistors Tr3 and Tr4. The MOS transistors Tr3 and Tr4 are each formed by the n-type source and drain region 33 and the gate electrode 36 formed via a gate insulating film.

Subsequently, a first interlayer insulating film 39 is formed on the surface of the first semiconductor substrate 31. Then, a connecting hole is formed in the interlayer insulating film 39, and a connection conductor 44 to be connected to a certain transistor is formed. When the connection conductors 44 having different heights are formed, a first insulating thin film 43a such as a silicon oxide film is formed on the whole surface including the top surface of the transistor, and a second insulating thin film 43b such as a silicon nitride film, which serves as an etching stopper, is laminated. On this second insulating thin film 43b, the first interlayer insulating film 39 is formed. The first interlayer insulating film 39 is formed by, for example, forming 10 nm to 150 nm of a P—SiO film (a plasma oxide film), and thereafter forming 50 nm to 1000 nm of a non-doped silicate glass (NSG) film or a phosphosilicate glass (PSG) film. Thereafter, a dTEOS film (a silicon oxide film formed by a plasma chemical vapor deposition method (CVD)) is formed with a thickness of 100 nm to 1000 nm, and subsequently a P—SiH4 film (a plasma oxide film) with a thickness of 50 nm to 200 nm is formed.

Thereafter, connecting holes having different depths are selectively formed in the first interlayer insulating film 39 until reaching the second insulating thin film 43b that serves as an etching stopper. Subsequently, the first insulating thin film 43a and the second insulating thin film 43b both having the same film thickness in each portion are selectively etched so as to be continuous to each connecting hole, thereby forming a connecting hole. Then, the connection conductor 44 is embedded in each connecting hole.

Subsequently, multiple layers (three layers, in this example) of Cu wirings 40 are formed so as to be connected to each connection conductor 44 through the interlayer insulating film 39, thereby forming a multilayer wiring layer 41. Each of the Cu wirings 40 is usually covered by an unillustrated barrier metal layer in order to prevent Cu diffusion. The barrier metal layer is formed by forming, for example, a SiN film or a SiC film with a thickness of 10 nm to 150 nm. Furthermore, the interlayer insulating films 39 as the second and subsequent layers are formed by forming a dTEOS film with a thickness of 100 nm to 1000 nm. The multilayer wiring layer 41 is formed by alternately forming the interlayer insulating film 39 and the Cu wiring 40 formed via the barrier metal layer. Although the multilayer wiring layer 41 is formed with the Cu wiring 40 in the present example, it may be formed with a metal wiring made of any other metal material.

In the above-described step, there is formed the first semiconductor substrate 31 having the pixel region 23 and the control circuit 24 in the state of a semi-finished product.

Returning to the flow chart of FIG. 4, a second semiconductor substrate is formed in step S12.

Figure 7:
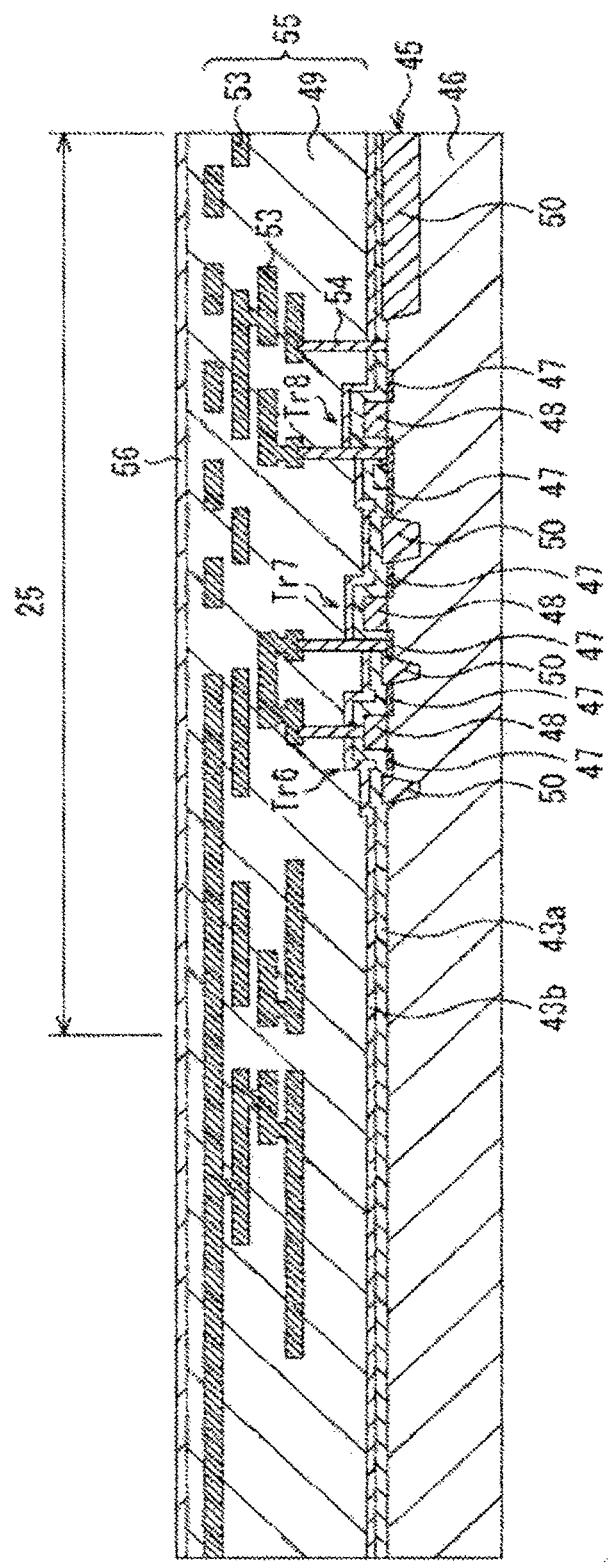
FIG. 7 is a diagram illustrating manufacturing steps of a solid-state imaging device.

Specifically, as illustrated in FIG. 7, a logic circuit 25 having a signal processing circuit for processing signals in the state of a semi-finished product is formed in a region that becomes a chip portion of a second semiconductor substrate (semiconductor wafer) 45 made of silicon or the like. That is, a plurality of MOS transistors constituting the logic circuit 25 is formed in a p-type semiconductor well region 46 on the front surface side of the second semiconductor substrate 45 in such a manner as to be isolated from each other by element isolating regions 50. Here, a plurality of MOS transistors is represented by MOS transistors Tr6, Tr7, and Tr8. The MOS transistors Tr6, Tr7, and Tr8 are each formed by a pair of n-type source and drain regions 47 and a gate electrode 48 formed via a gate insulating film. The logic circuit 25 can be constituted by a CMOS transistor.

Subsequently, a first interlayer insulating film 49 is formed on the surface of the second semiconductor substrate 45. Then, a connecting hole is formed in the interlayer insulating film 49, and a connection conductor 54 to be connected to a certain transistor is formed. When the connection conductors 54 having different heights are formed, a first insulating thin film 43a such as a silicon oxide film and a second insulating thin film 43b such as a silicon nitride film which serves as an etching stopper are laminated on the whole surface including the top surface of the transistor, in a similar manner to the above description. On this second insulating thin film 43b, the first interlayer insulating film 49 is formed. Then, connecting holes having different depths are selectively formed in the first interlayer insulating film 39 until reaching the second insulating thin film 43b that serves as an etching stopper. Subsequently, the first insulating thin film 43a and the second insulating thin film 43b both having the same film thickness in each portion are selectively etched so as to be continuous to each connecting hole, thereby forming a connecting hole. Then, the connection conductor 54 is embedded in each connecting hole.

Thereafter, formation of the interlayer insulating film 49 and formation of multiple layers of metal wirings are repeated, thereby to form a multilayer wiring layer 55. In the present embodiment, four layers of Cu wirings 53 are formed in a similar step to the formation step of the multilayer wiring layer 41 formed on the first semiconductor substrate 31.

Then, the Cu wiring 53 is coated to form the interlayer insulating film 49. The interlayer insulating film 49 on the Cu wiring 53 is formed by forming, for example, 500 nm to 2000 nm of an HDP film (high density plasma oxide film) or a P—SiO film (plasma oxide film), and thereafter further forming a P—SiO film with a thickness of 100 nm to 2000 nm thereon. Thus, the multilayer wiring layer 55 including four Cu wirings 53 formed via the interlayer insulating film 49 is formed.

Furthermore, on the multilayer wiring layer 55, there is formed a stress correction film 56 for reducing a stress caused by bonding between the first semiconductor substrate 31 and the second semiconductor substrate 45. The stress correction film 56 is formed by forming, for example, a P—SiN film or a P—SiON film (a plasma oxide film) with a thickness of 100 nm to 2000 nm.

In the above-described step, there is formed the second semiconductor substrate 45 having a logic circuit in the state of a semi-finished product.

Returning to the flow chart of FIG. 4, in step S13, the first semiconductor substrate and the second semiconductor substrate are bonded together.

Figure 8:
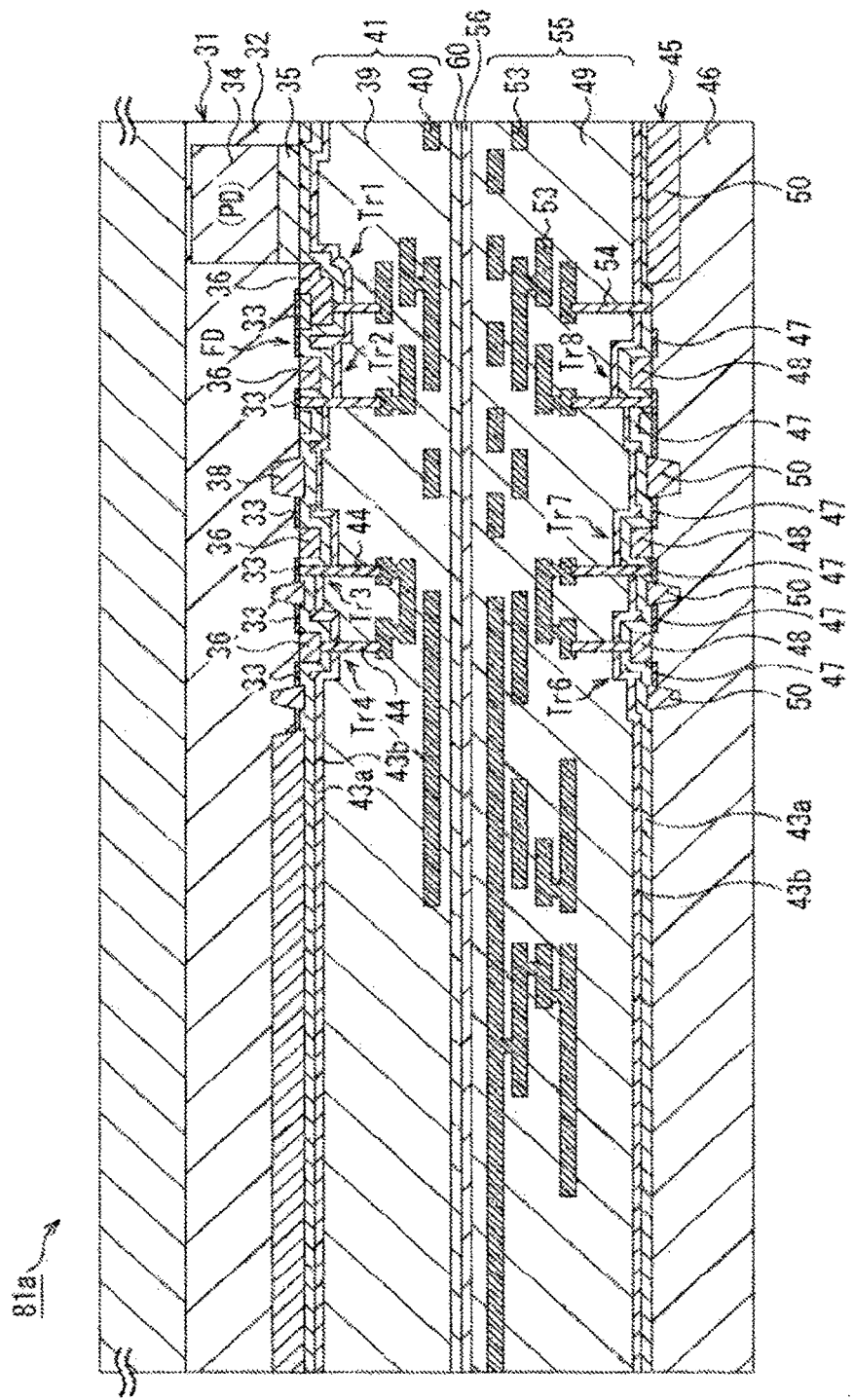
FIG. 8 is a diagram illustrating manufacturing steps of a solid-state imaging device.

Specifically, as illustrated in FIG. 8, the first semiconductor substrate 31 and the second semiconductor substrate 45 are bonded together such that the multilayer wiring layers 41 and 55 face each other. Bonding is, for example, performed with an adhesive agent. For connecting with an adhesive agent, an adhesive agent layer 60 is formed on one of the connecting surfaces of the first semiconductor substrate 31 and the second semiconductor substrate 45, so that the both are superimposed on each other and connected through the adhesive agent layer 60. In the present embodiment, bonding is performed such that the first semiconductor substrate 31 having the pixel region is disposed in the upper layer, and the second semiconductor substrate 45 is disposed in the lower layer.

Although the first semiconductor substrate 31 and the second semiconductor substrate 45 are bonded together through the adhesive agent layer 60 in the present embodiment, they may be alternatively bonded together by plasma connecting. In the case of plasma connecting, a plasma TEOS film, a plasma SiN film, a SiON film (a block film), a SiC film, or the like is formed on each of the connecting surfaces of the first semiconductor substrate 31 and the second semiconductor substrate 45. The connecting surfaces on which these films have been formed are subjected to plasma treatment and superimposed on each other, and thereafter subjected to an annealing treatment and connected to each other. The bonding treatment is preferably performed in a low temperature process at 400° C. or lower that does not influence wirings and the like.

By laminating and bonding the first semiconductor substrate 31 and the second semiconductor substrate 45, there is formed a laminated body 81a including two different types of substrates.

In step S14, the first semiconductor substrate is reduced in thickness.

Figure 9:
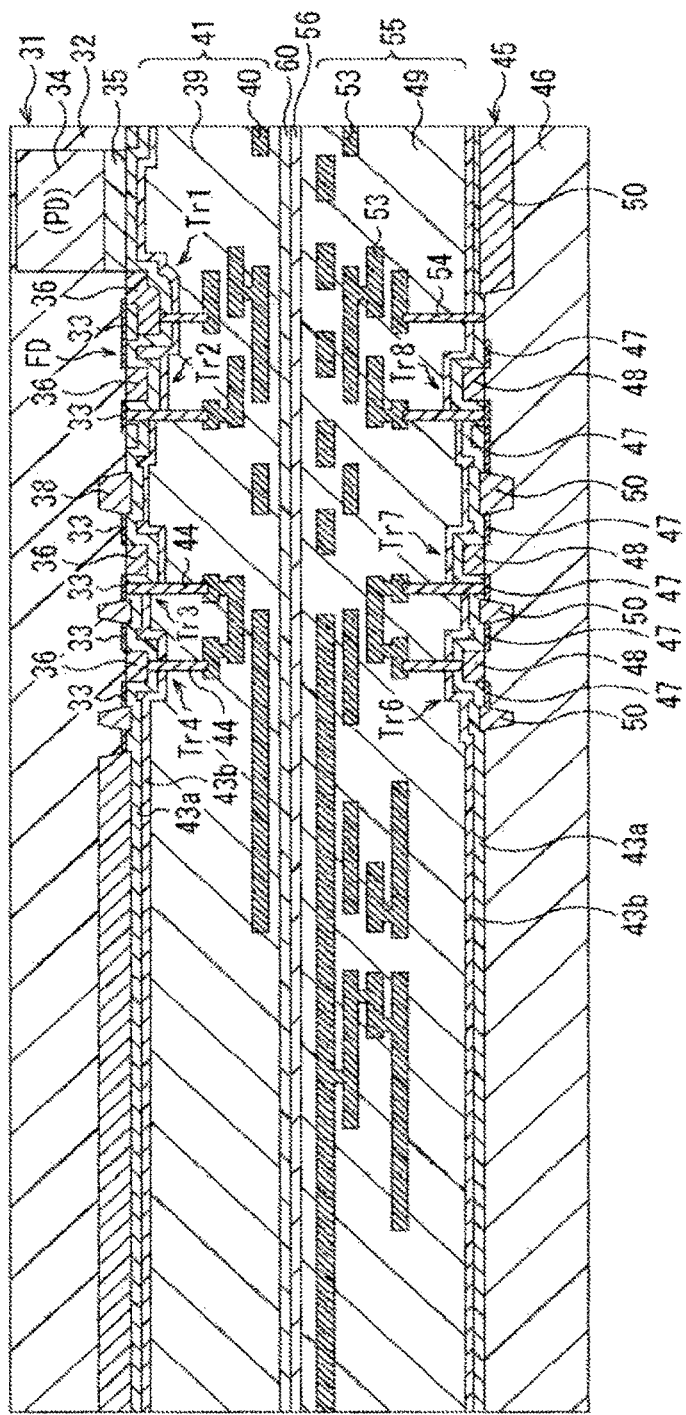
FIG. 9 is a diagram illustrating manufacturing steps of a solid-state imaging device.

Specifically, as illustrated in FIG. 9, the first semiconductor substrate 31 is ground and polished from its back side so that the first semiconductor substrate 31 is reduced in thickness. This reduction in thickness is performed in such a manner as to border on a photodiode (PD). When, for example, a semiconductor substrate formed with a p-type high concentration impurity layer as an etching stopper layer (not illustrated) is used as the first semiconductor substrate 31, reduction in thickness and planarization can be achieved by removing the substrate by etching until reaching the etching stopper layer. After the reduction in thickness has been performed, a p-type semiconductor layer for suppressing dark current is formed on the back surface of the photodiode (PD). The thickness of the first semiconductor substrate 31, which is, for example, about 750 µm, is reduced to, for example, about 2 µm to 5 µm.

In a known method, such reduction in thickness is performed by bonding a separately prepared support substrate to the multilayer wiring layer 41 side of the first semiconductor substrate 31. However, in the present embodiment, reduction in thickness of the first semiconductor substrate 31 is performed by using the second semiconductor substrate 45 having the logic circuit 25 also as the support substrate. This back surface of the first semiconductor substrate 31 serves as a light incident surface in the back-surface irradiation type solid-state imaging device.

In step S15, a reflection preventing film, an oxide film, and a nitride film are formed.

Figure 10:
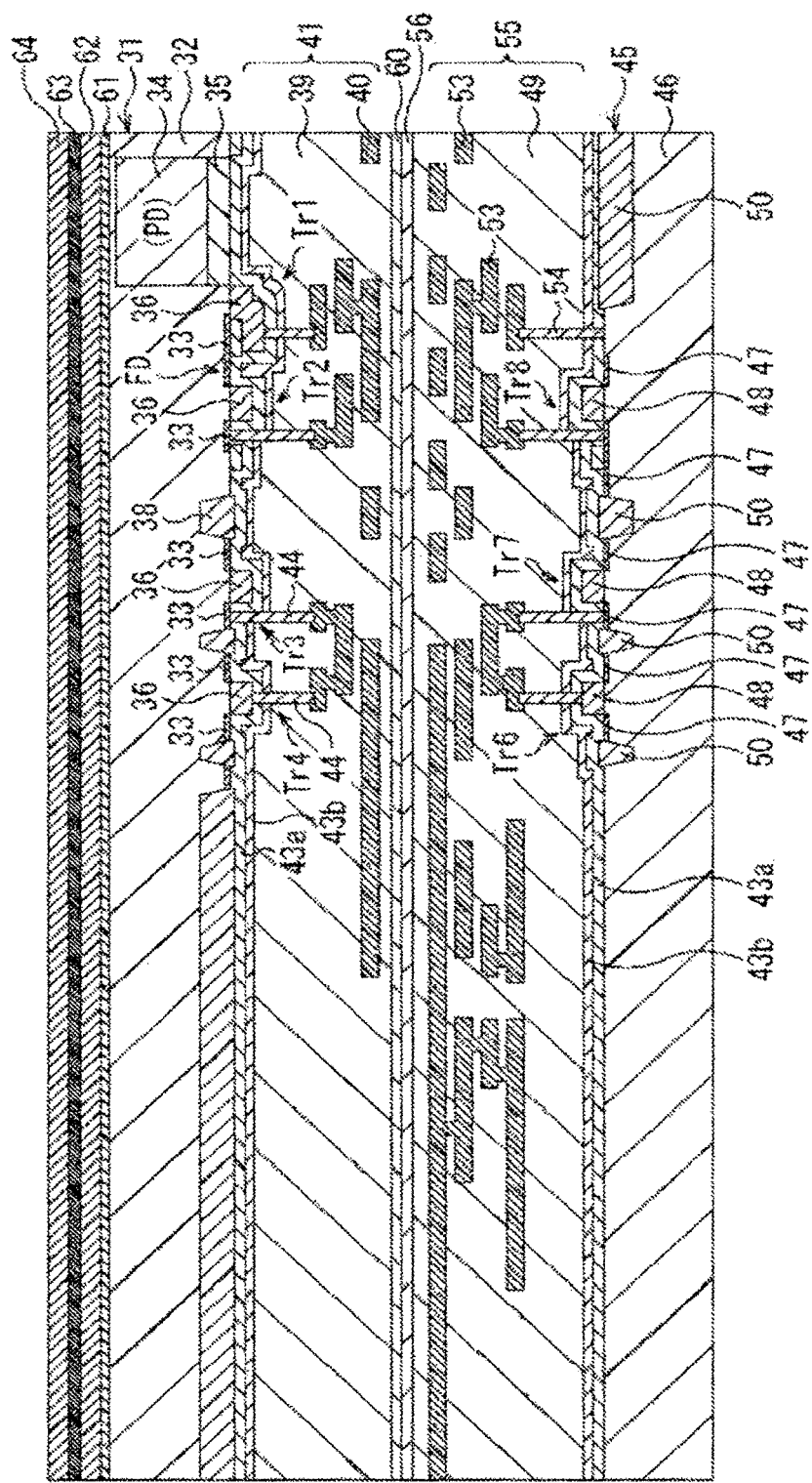
FIG. 10 is a diagram illustrating manufacturing steps of a solid-state imaging device.

Specifically, as illustrated in FIG. 10, a reflection preventing film 61 is formed on the back surface of the first semiconductor substrate 31. The reflection preventing film 61 is formed by forming, for example, a film of TaO2 or HfO2 with a thickness of 5 nm to 100 nm. The reflection preventing film 61 made of TaO2 or HfO2 has the pinning effect at the interface with the first semiconductor substrate 31, and this reflection preventing film 61 suppresses generation of dark current at the interface with the back surface side of the first semiconductor substrate 31. The formed reflection preventing film 61 is subjected to an annealing treatment for dehydrating TaO2 or HfO2 constituting the reflection preventing film 61. Since the reflection preventing film 61 is dehydrated by this annealing treatment, a film such as an HDP film formed in the subsequent step can be prevented from peeling.

Thereafter, a first oxide film 62 constituted by a P—SiO film or the like is formed with a thickness of 100 nm to 1500 nm on the reflection preventing film 61. Furthermore, a nitride film 63 is formed on the first oxide film 62, and a second oxide film 64 is formed on the nitride film 63.

In step S16, a pattern opening process in the Al wiring portion is performed.

Figure 11:
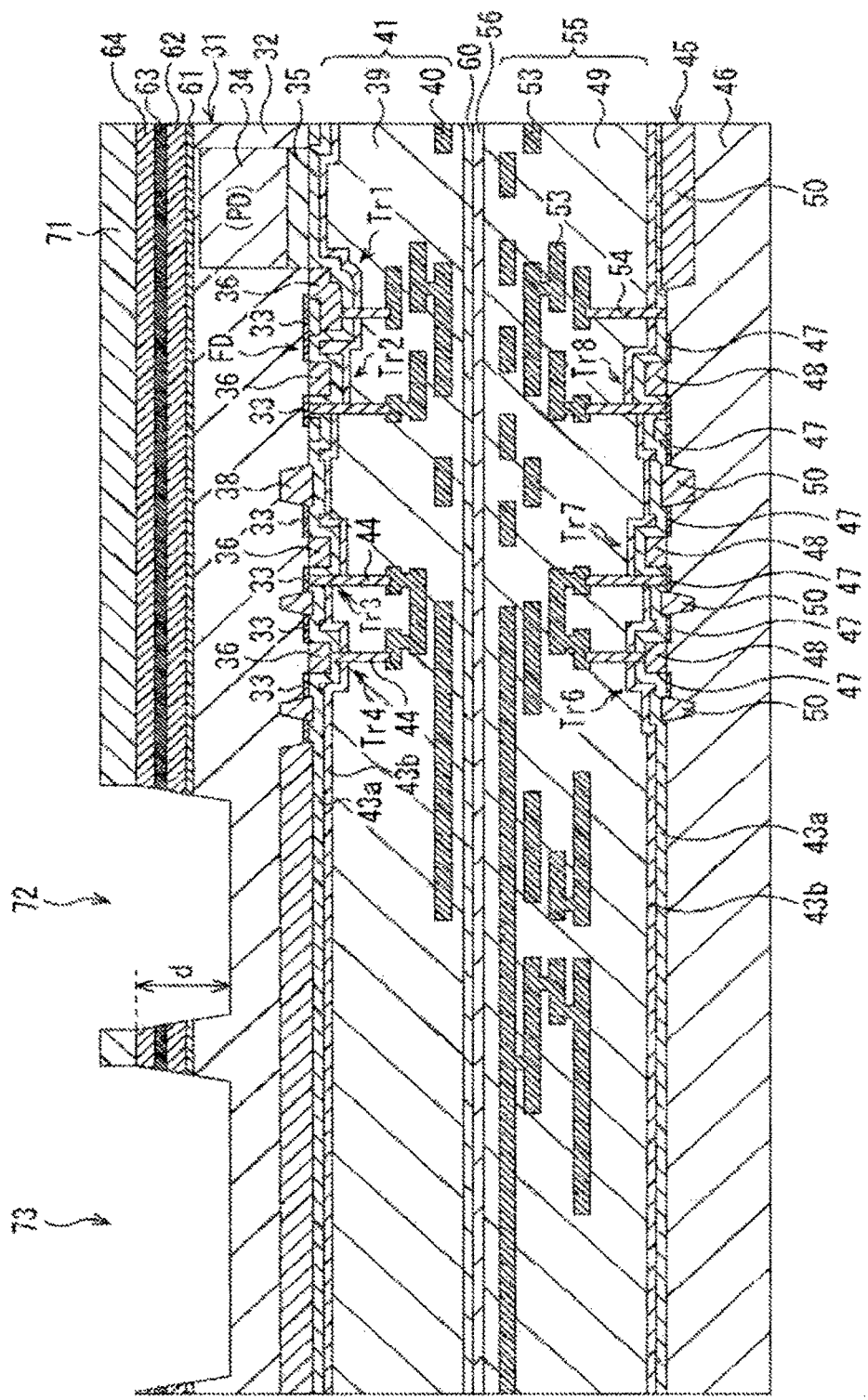
FIG. 11 is a diagram illustrating manufacturing steps of a solid-state imaging device.

Specifically, a photoresist 71 is applied on the second oxide film 64, and subjected to patterning. Then, as illustrated in FIG. 11, an opening 72 and an opening 73 of Al wirings are formed by etching. In the present embodiment, for embedding the Al wirings in the first semiconductor substrate 31 constituted by a Si substrate, depth d of each of the openings 72 and 73 needs to be defined to be a depth that is a total amount of the thickness of an Al wiring to be embedded and the thickness of an insulating film to be formed on the Al wiring. For example, when the thickness of an Al wiring is 600 nm, and the thickness of an insulating film to be formed on the Al wiring is 200 nm, depth d of each of the openings 72 and 73 is defined to be about 1000 nm. Here, when the thickness of the reflection preventing film 61 to the oxide film 64 formed on the first semiconductor substrate 31 is 500 nm, the depth to which the first semiconductor substrate 31 is excavated is 300 nm.

In step S17, a penetration connecting hole for forming a penetration connecting portion is opened.

Figure 12:
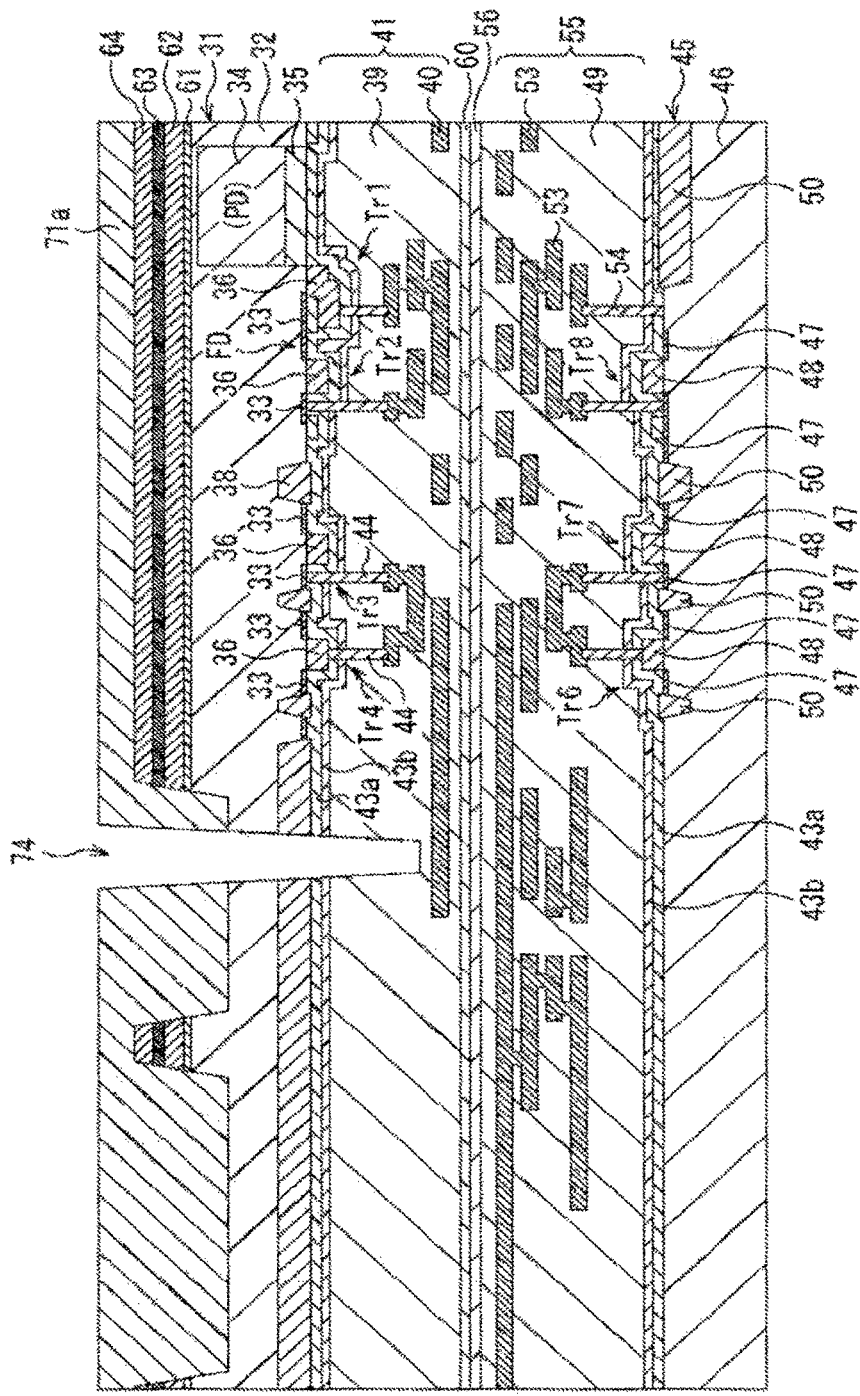
FIG. 12 is a diagram illustrating manufacturing steps of a solid-state imaging device.
Figure 13:
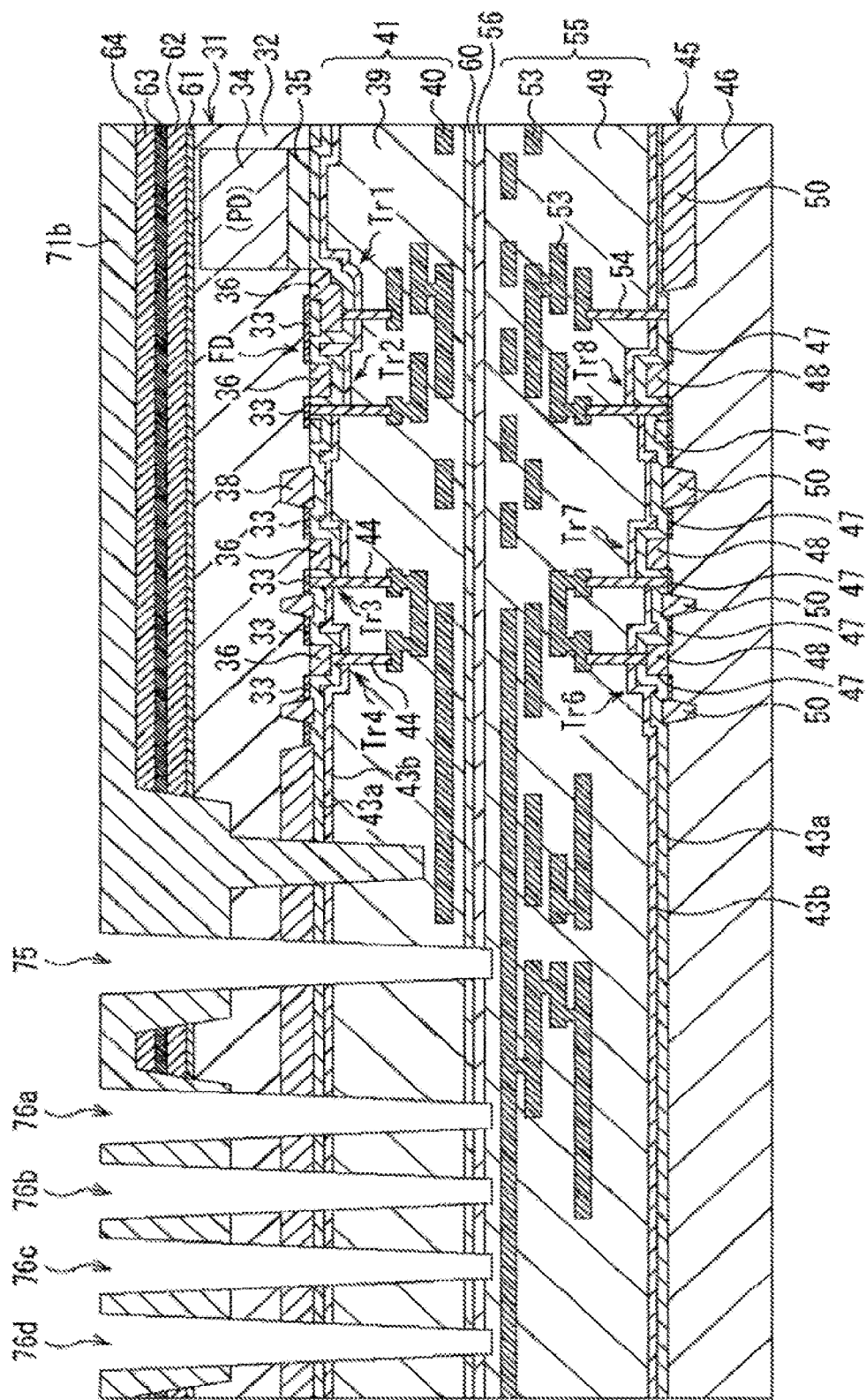
FIG. 13 is a diagram illustrating manufacturing steps of a solid-state imaging device.
Figure 14:
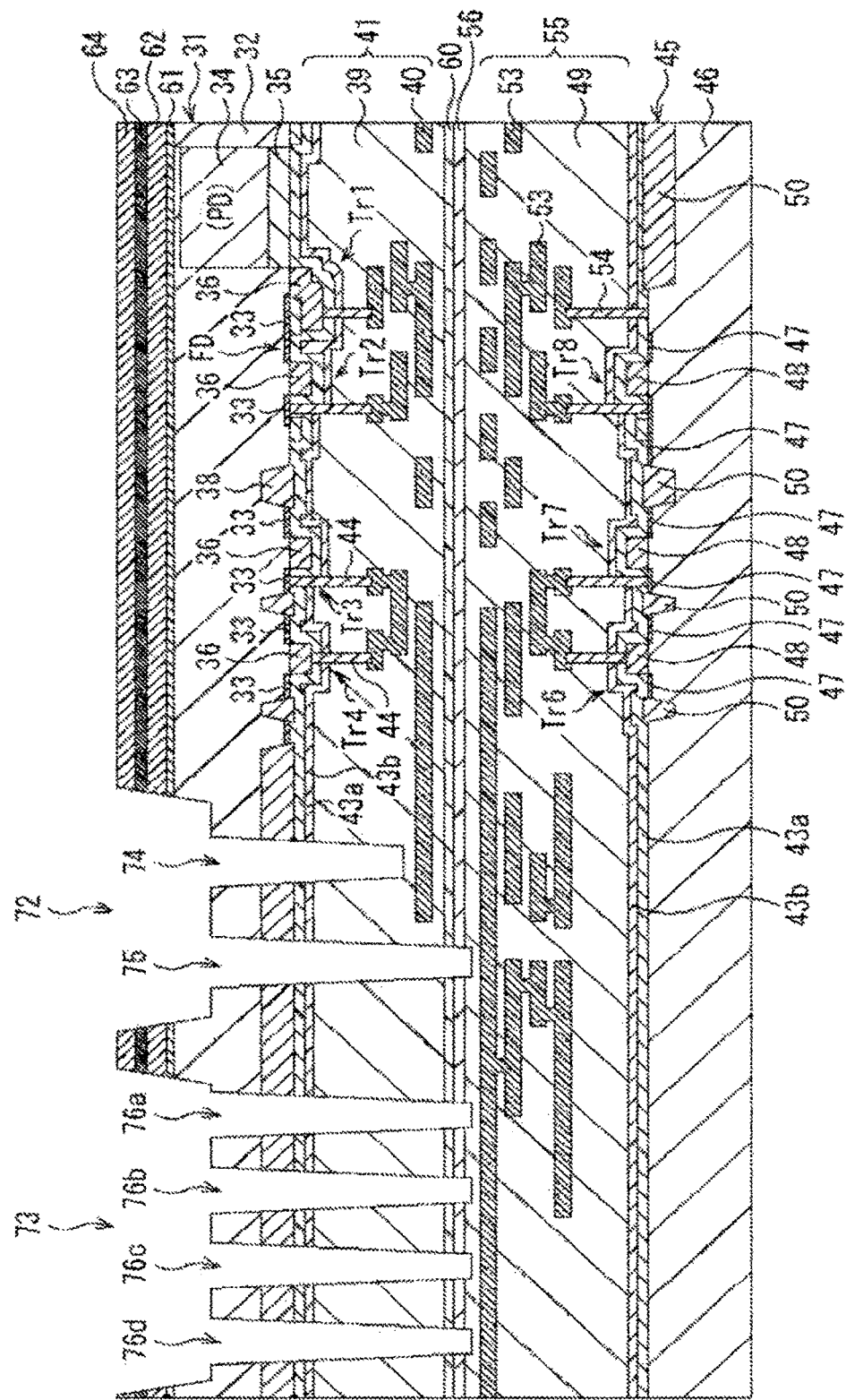
FIG. 14 is a diagram illustrating manufacturing steps of a solid-state imaging device.

Specifically, as illustrated in FIG. 12, a connecting hole 74 is opened by applying a photoresist 71a and performing patterning, and thereafter performing etching. Subsequently, as illustrated in FIG. 13, penetration connecting holes 75, 76a, 76b, 76c, and 76d are opened by applying a photoresist 71b and performing patterning, and thereafter performing etching. As a result, as illustrated in FIG. 14, the connecting hole 74 and the penetration connecting hole 75 are formed in the opening 72, and the penetration connecting holes 76a to 76d are formed in the opening 73. The connecting hole 74 is excavated until immediately before reaching the Cu wiring 40 formed in the first semiconductor substrate, and the penetration connecting holes 75, 76a to 76d are excavated until immediately before reaching the Cu wiring 53 formed in the second semiconductor substrate.

Figure 15:
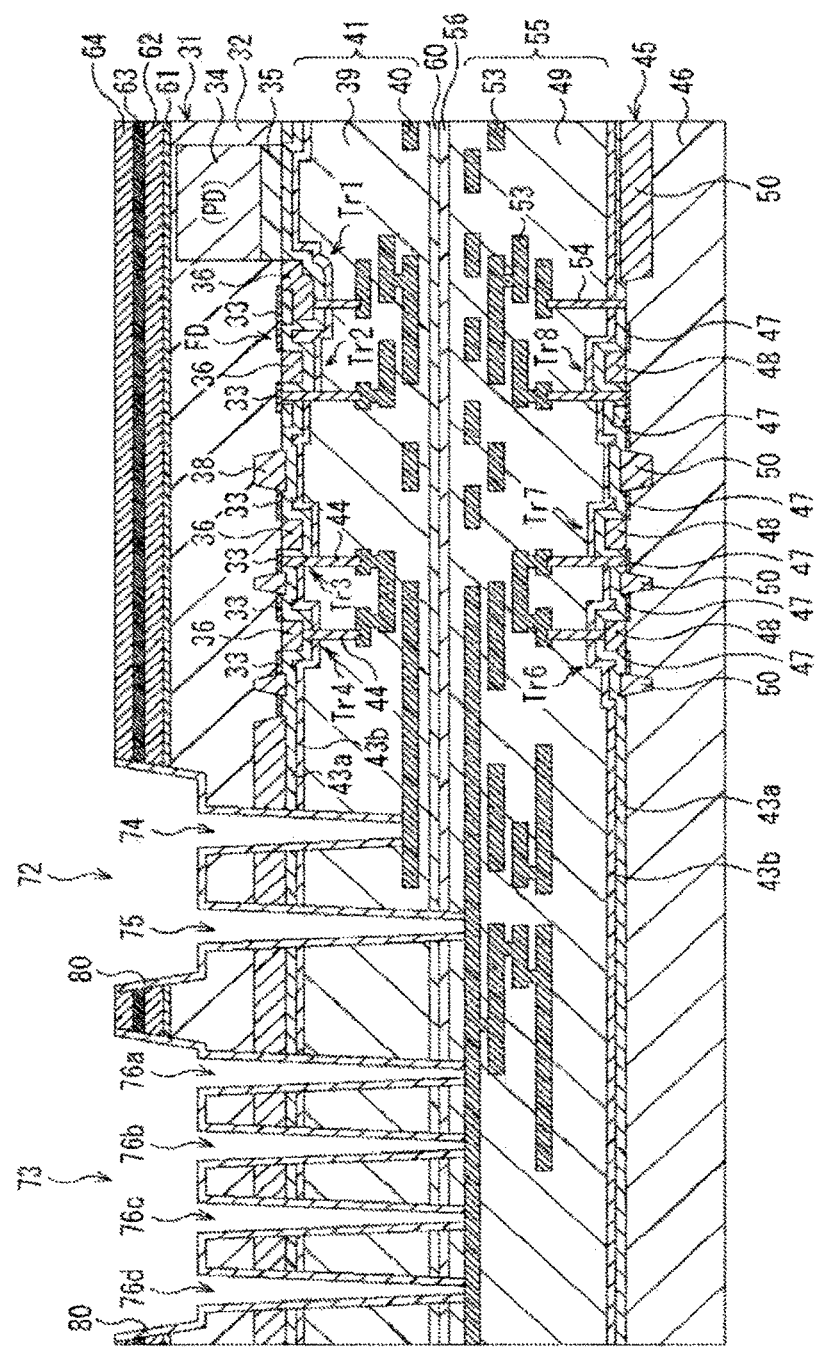
FIG. 15 is a diagram illustrating manufacturing steps of a solid-state imaging device.

In step S18, an insulating film is formed on the opening 72 including the connecting hole 74 and the penetration connecting hole 75 and the opening 73 including the penetration connecting holes 76a to 76d, and etch back is performed. Specifically, after a SiN film or the like is formed, a TEOS film as an insulating film is formed. Accordingly, as illustrated in FIG. 15, an insulating film 80 remains on the opening 72 and the side walls of the connecting hole 74 and the penetration connecting hole 75 as well as on the opening 73 and the side walls of the connecting holes 76a to 76d. Furthermore, the bottom of the connecting hole 74 reaches the Cu wiring 40 formed in the first semiconductor substrate 31, and the bottoms of the penetration connecting holes 75, 76a, 76b, 76c, and 76d reach the Cu wiring 53 formed in the second semiconductor substrate 45.

In step S19, metal is embedded in the connecting hole 74 and the penetration connecting holes 75 and 76a to 76d.

Figure 16:
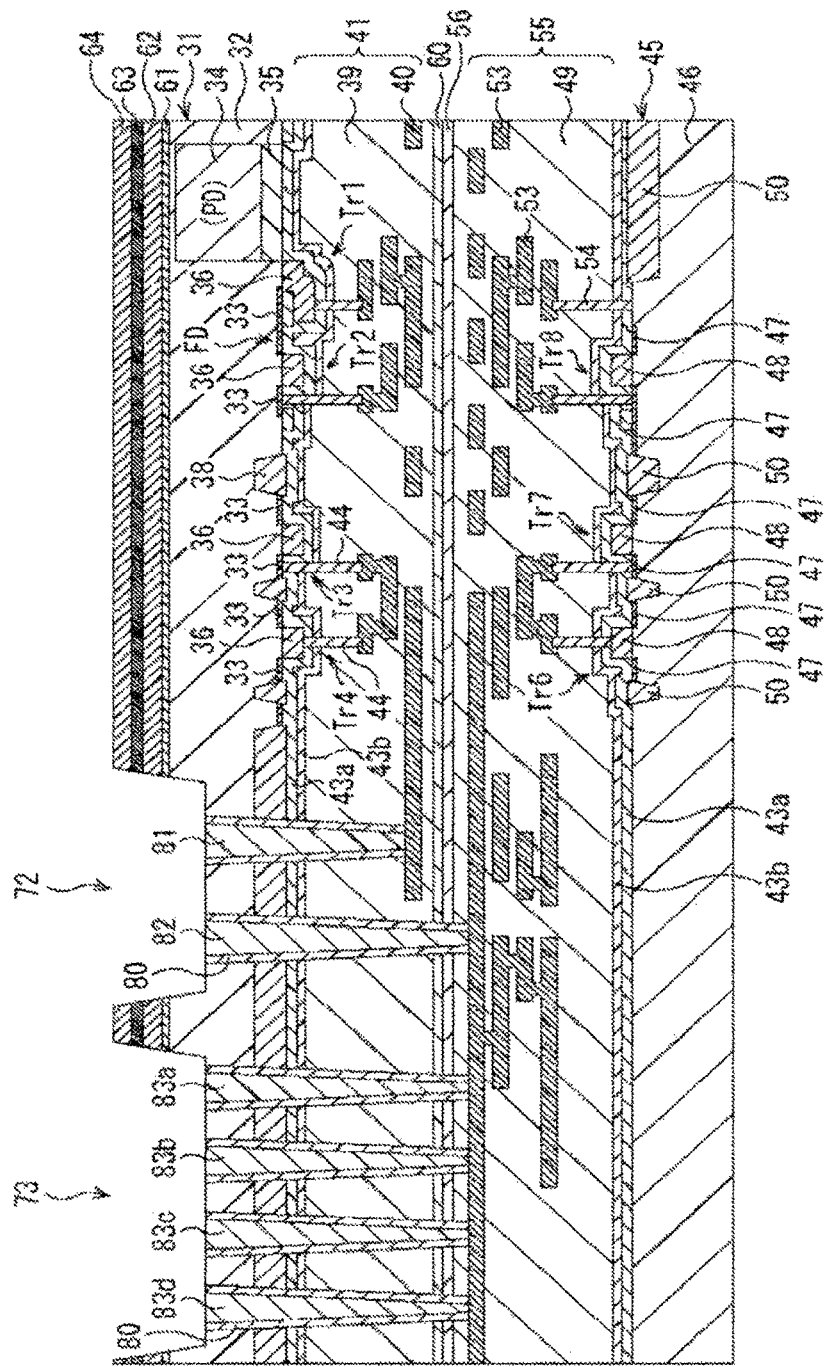
FIG. 16 is a diagram illustrating manufacturing steps of a solid-state imaging device.

When W is embedded as metal, an appropriate pretreatment is firstly performed, and then a film of high melting point metal such as Ti, TiN, Ta, and TaN is formed as an adhesion layer. Thereafter, blanket W-CVD is performed. Furthermore, etch back is performed. Thus, as illustrated in FIG. 16, the connecting portion 81 and the penetration connecting portions 82, 83a, 83b, 83c, and 83d are formed.

It is noted that the material of the connecting portion 81 and the penetration connecting portions 82 and 83a to 83d is not limited to W, and may be Cu. In this case, embedding is performed by a Cu-Seed layer and Cu plating, and then etch back on the whole surface is performed by ion beam etching (IBE) or the like. Thus, the connecting portion 81 and the penetration connecting portions 82 and 83a to 83d are formed.

In step S20, an insulating film is formed in the openings 72 and 73.

Figure 17:
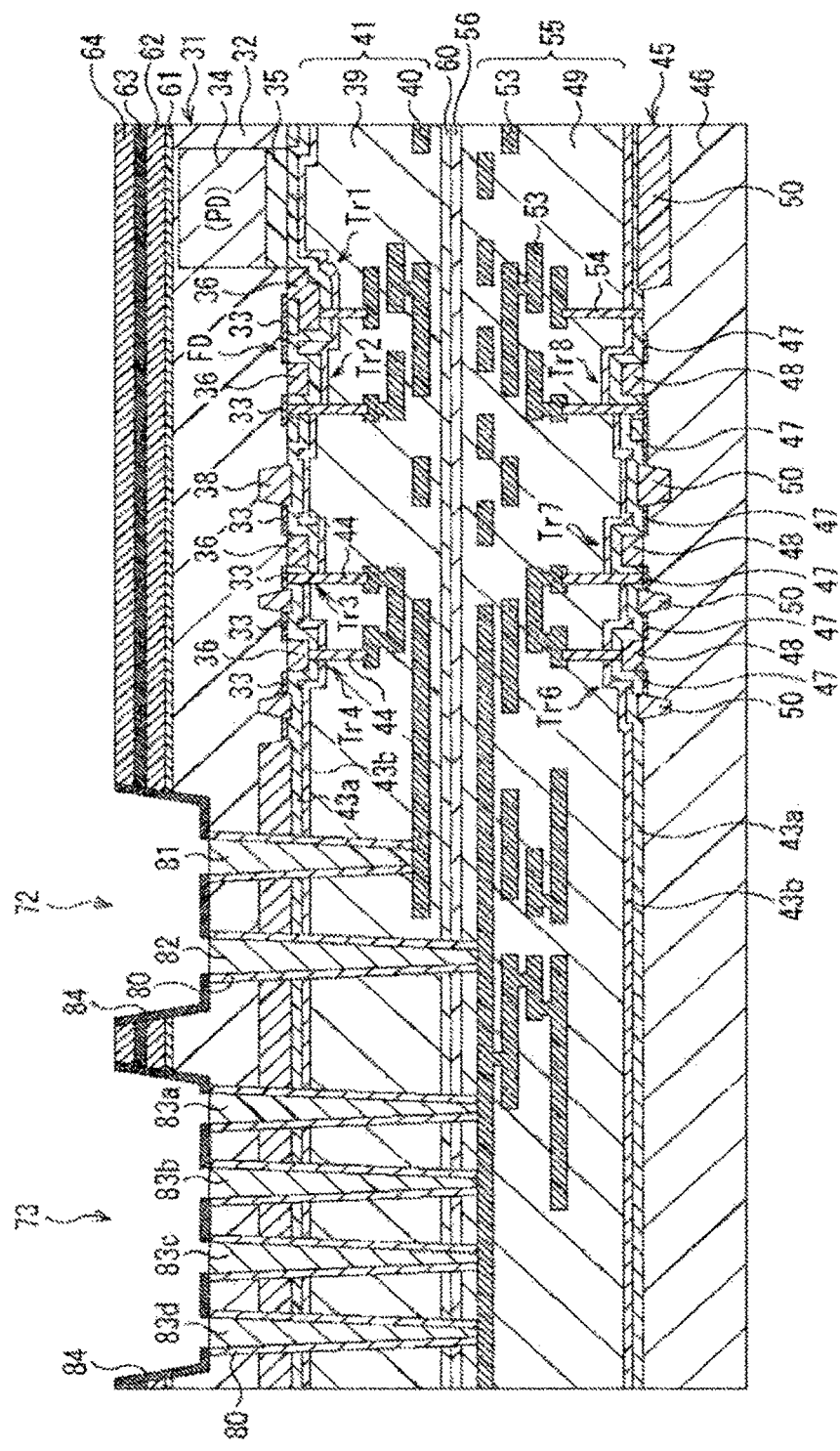
FIG. 17 is a diagram illustrating manufacturing steps of a solid-state imaging device.

Specifically, as illustrated in FIG. 17, an insulating film 84 is patterned on the side walls and the bottoms of the openings 72 and 73, such that the top surfaces of the connecting portion 81 and the penetration connecting portions 82 and 83a to 83d are opened. The insulating film 84 has a laminated structure in which a nitride film and an oxide film, for example, are laminated to each other. As described later, Al wirings are to be embedded in the openings 72 and 73. Conduction between the first semiconductor substrate 31 constituted by a Si substrate and the Al wirings can be prevented by the insulating film 84.

Figure 18:
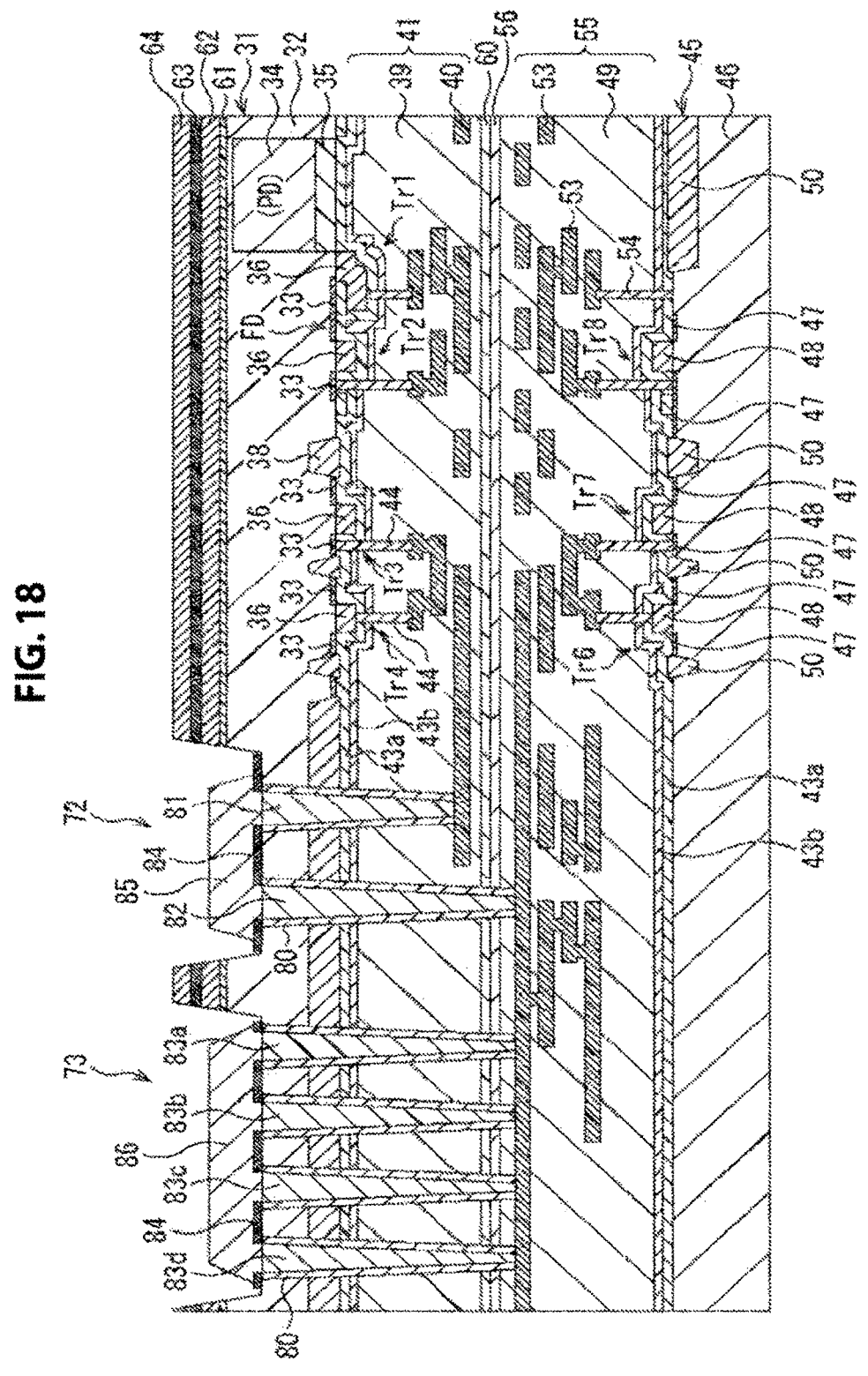

In step S21, an Al wiring material is embedded in the openings 72 and 73, and patterning is performed. Accordingly, as illustrated in FIG. 18, an Al wiring 85 is formed in the opening 72, and an Al wiring 86 is formed in the opening 73.

In step S22, an oxide film is embedded.

Figure 19:
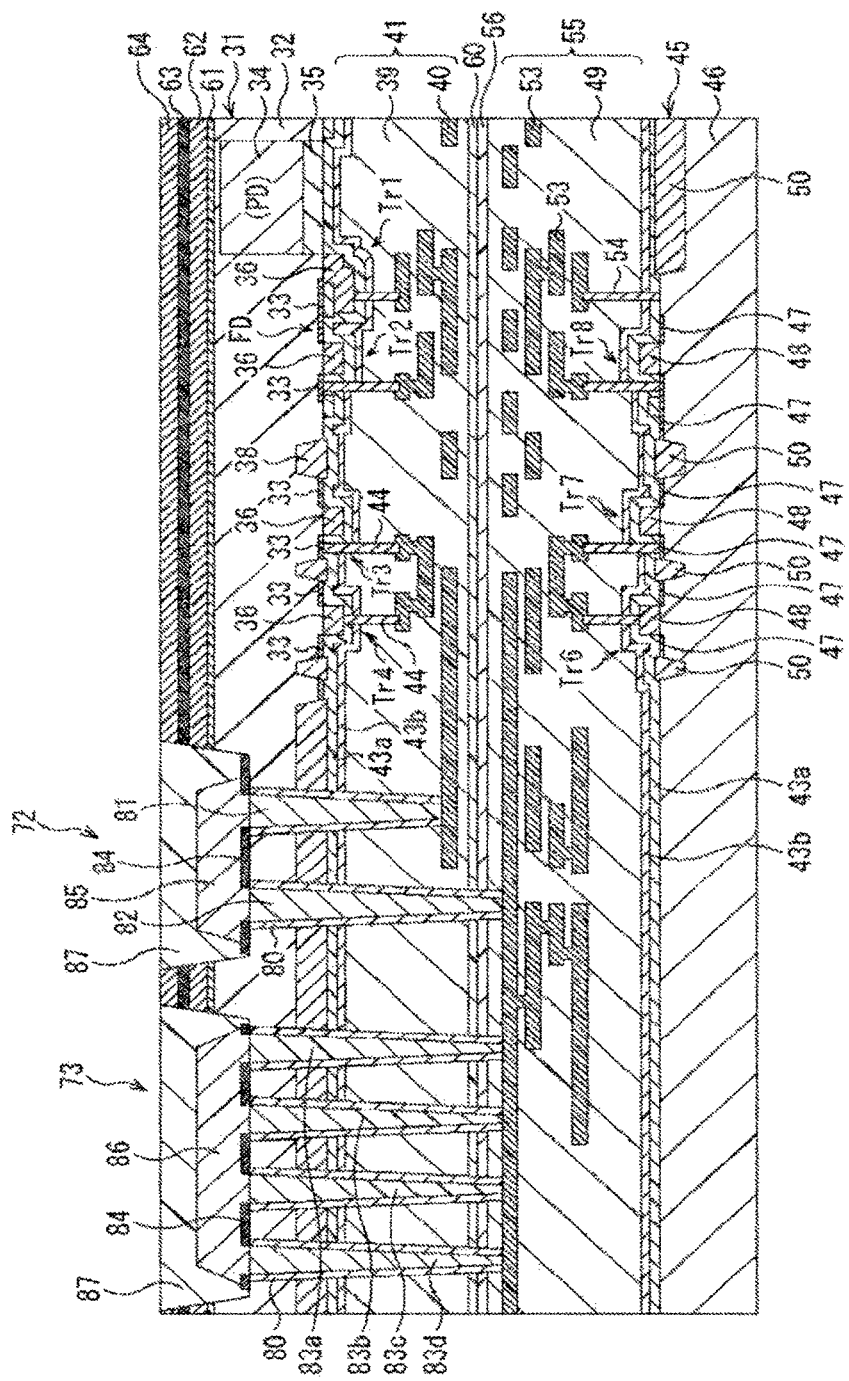
FIG. 19 is a diagram illustrating manufacturing steps of a solid-state imaging device.

Specifically, as illustrated in FIG. 19, an oxide film 87 is embedded in the opening 72 in which the Al wiring 85 has been formed and in the opening 73 in which the Al wiring 86 has been formed. Here, planarization by CMP is performed to eliminate steps between portions where the oxide film 87 is embedded in the openings 72 and 73 and other portions.

In step S23, a light shielding film and a planarizing film are formed.

Figure 20:
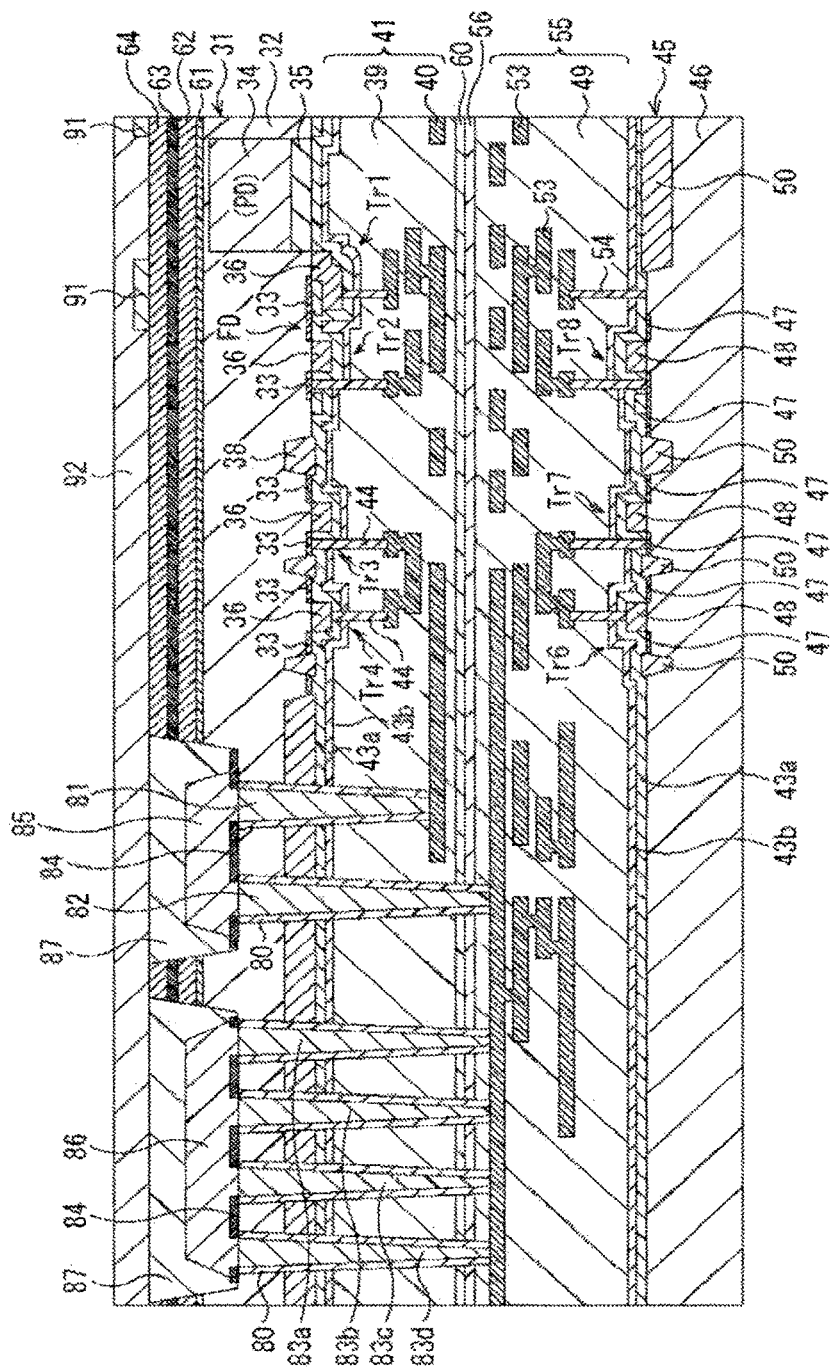
FIG. 20 is a diagram illustrating manufacturing steps of a solid-state imaging device.

Specifically, as illustrated in FIG. 20, a light shielding film 91 is formed on the oxide film 64 in a region other than the region in which a photodiode (PD) is formed, and a planarizing film 92 is formed on the light shielding film 91. The light shielding film 91 is formed with, for example, metal such as W and Al. Alternatively, the light shielding film 91 may be formed by laminating W and Ti (or Ta, TiN), or by laminating Al and Ti (or Ta, TiN). In this case, for example, a film formed in the lower layer has a film thickness of 50 nm to 500 nm, and a film formed in the upper layer has a film thickness of 5 nm to 100 nm. The planarizing film 92 is applied by spin coating or the like.

In step S24, a color filter is formed.

Figure 21:
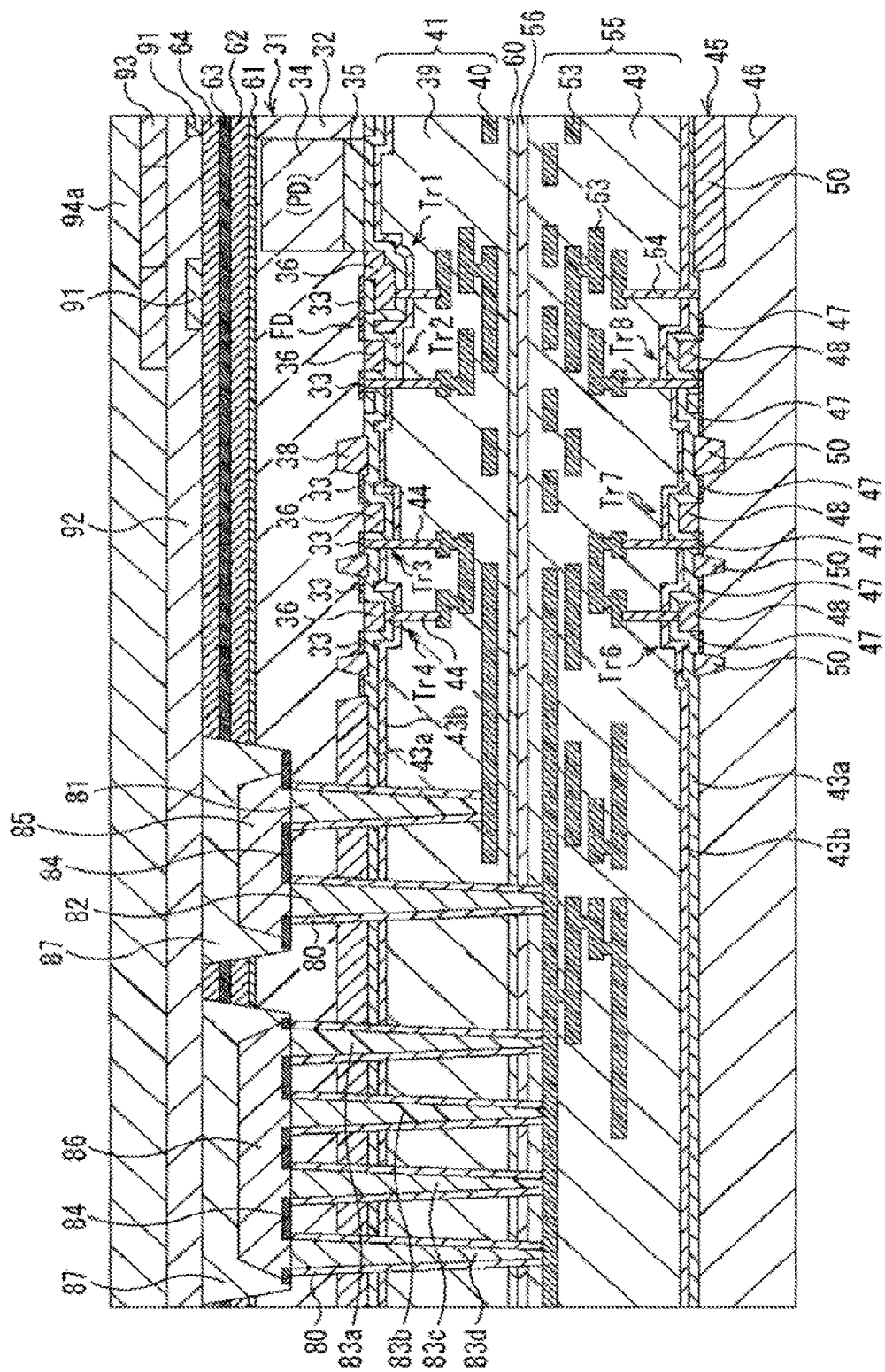
FIG. 21 is a diagram illustrating manufacturing steps of a solid-state imaging device.

Specifically, as illustrated in FIG. 21, an on-chip color filter 93 of red (R), green (G), blue (B), or the like is formed on the planarizing film 92 in such a manner as to correspond to each pixel. The on-chip color filter 93 is formed above the photodiode (PD) constituting a pixel array by forming an organic film containing a pigment or dye of each color and performing patterning.

Thereafter, in step S25, a film of an on-chip lens material 94a is formed in a pixel array region containing the area on the on-chip color filter 93. The on-chip lens material 94a to be used is, for example, an organic film or an inorganic film such as SiO, SiN and SiON, and is formed into a film with a thickness of 3000 nm to 4500 nm.

In step S27, a resist for an on-chip lens is formed.

Figure 22:
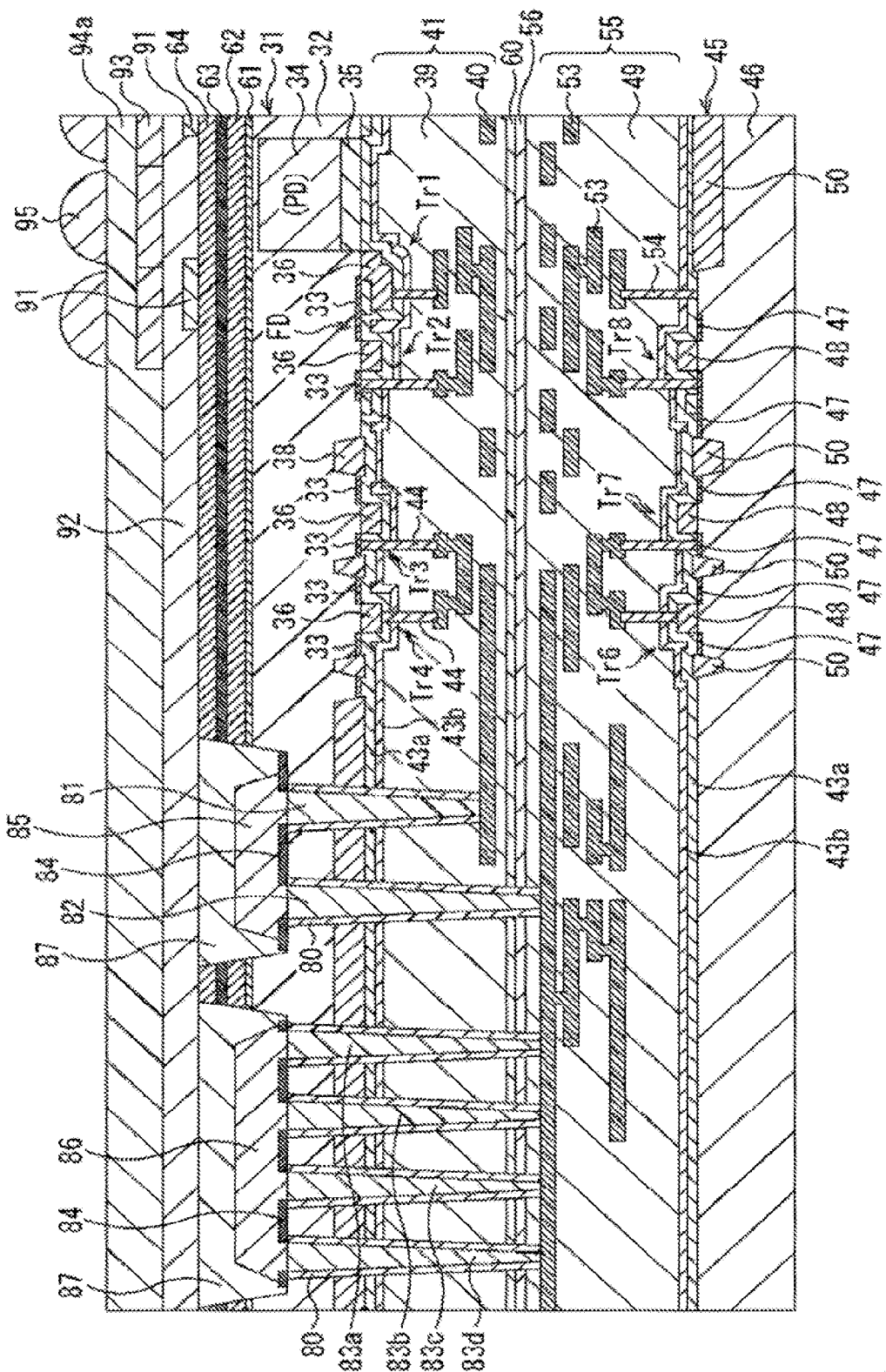
FIG. 22 is a diagram illustrating manufacturing steps of a solid-state imaging device.

Specifically, as illustrated in FIG. 22, a resist 95 for an on-chip lens is formed in a region corresponding to each pixel on the on-chip lens material 94a with a thickness of, for example, 300 nm to 1000 nm.

In step S28, an etching treatment is performed thereby to form an on-chip lens. Accordingly, the shape of the resist 95 for an on-chip lens is transferred to the on-chip lens material 94a, thereby to form an on-chip lens 94 above each pixel as illustrated in FIG. 23.

Then, in step S29, an opening of an electrode pad is formed.

Figure 23:
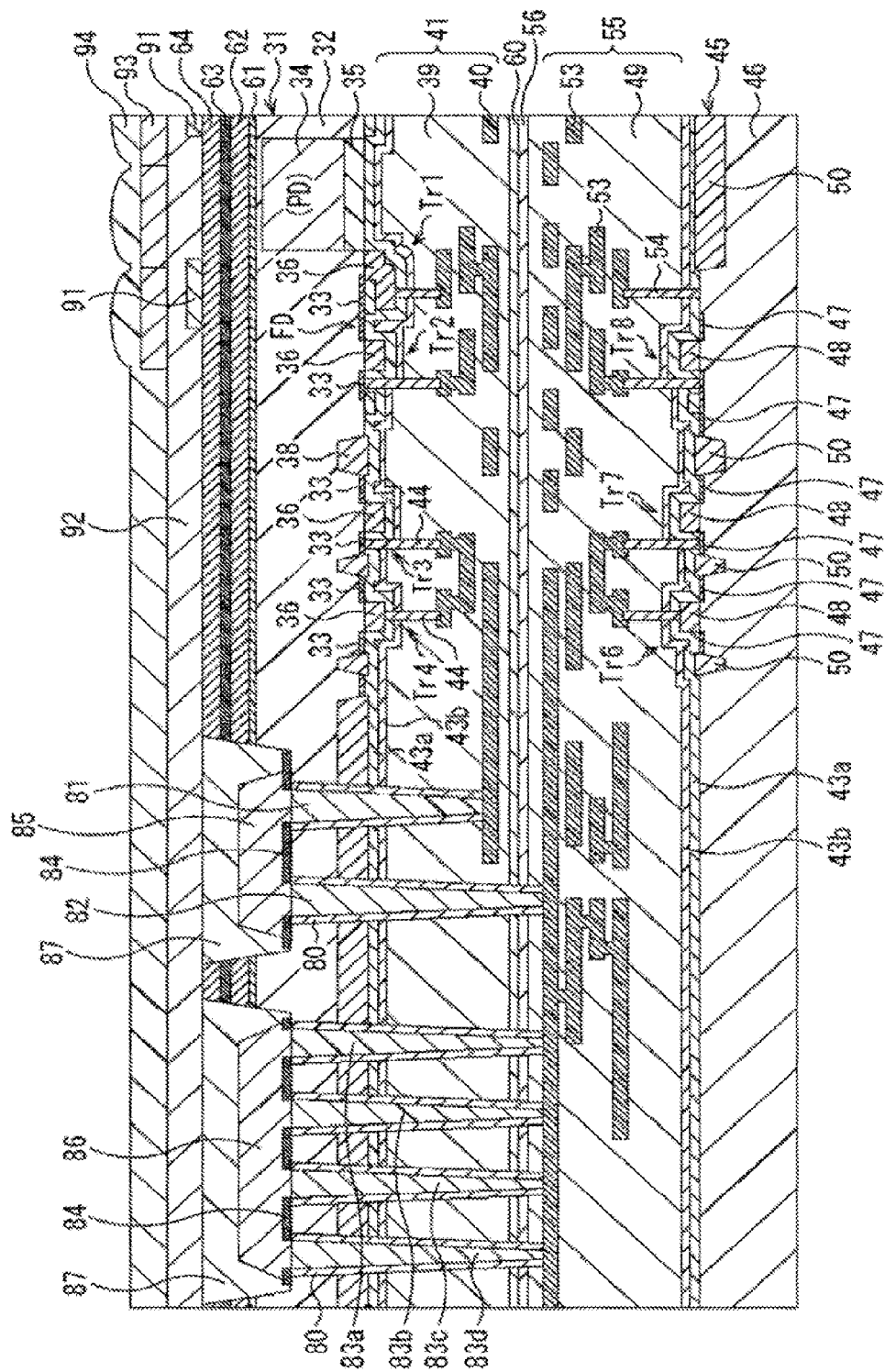
FIG. 23 is a diagram illustrating manufacturing steps of a solid-state imaging device.
Figure 24:
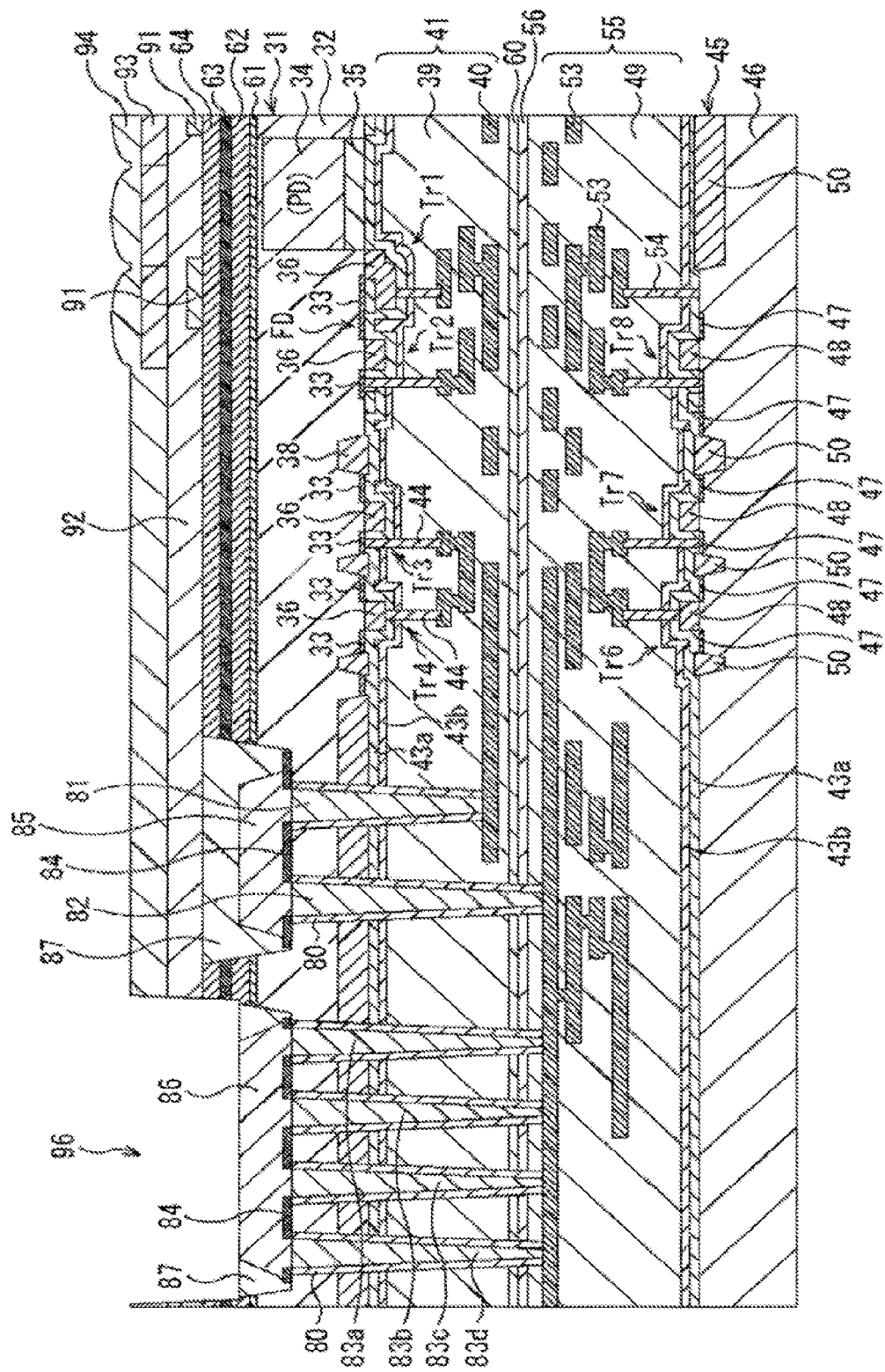
FIG. 24 is a diagram illustrating manufacturing steps of a solid-state imaging device.

Specifically, there is formed a resist film having an opening on the on-chip lens 94 (the on-chip lens material 94a) in a region corresponding to the Al wiring 86 in the state of FIG. 23, and etching is performed under a predetermined etching condition until the top surface of the Al wiring 86 is exposed. Thus, as illustrated in FIG. 24, there is formed an opening 96 in which the top surface of the Al wiring 86 is exposed.

The Al wiring 86 is electrically connected to the Cu wiring 53 formed in the second semiconductor substrate 45, through the penetration connecting portions 83a to 83d formed in such a manner as to penetrate from the first semiconductor substrate 31 into the second semiconductor substrate 45.

Since the top surface of the Al wiring 86 is exposed in the opening 96, the Al wiring 86 is configured as an electrode pad for connecting with exterior wirings. It is preferable to form a plurality of the Al wirings 86 configured as an electrode pad on each of three or four sides outside the pixel region formed in each chip.

The laminated body 81a formed by laminating two semiconductor substrates is thereafter divided into chips through dicing processing. Thus, the solid-state imaging device according to the present embodiment is accomplished.

According to the above-described process, in comparison to the conventional method in which the Al wiring is formed in the wiring layer of the second semiconductor substrate, planarization by embedding of the Al wiring does not need to be sufficiently performed, and the number of steps can be reduced.

Furthermore, since a Si substrate, instead of a wiring layer constituted by a Low-k film, is formed in the layer below the Al wiring in the first semiconductor substrate, resistance to a mechanical stress caused by bumps and bonding increases, and mechanical strength can be enhanced.

Furthermore, although the Al wiring formed in the first semiconductor substrate is embedded in the Si substrate, the Al wiring and the Si substrate are insulated from each other by the insulating film. Therefore, an insulating spacer layer does not need to be disposed near the opening in the Si substrate as the first semiconductor substrate, enabling the number of steps to be further reduced.

Other Configuration Examples

Figure 25:
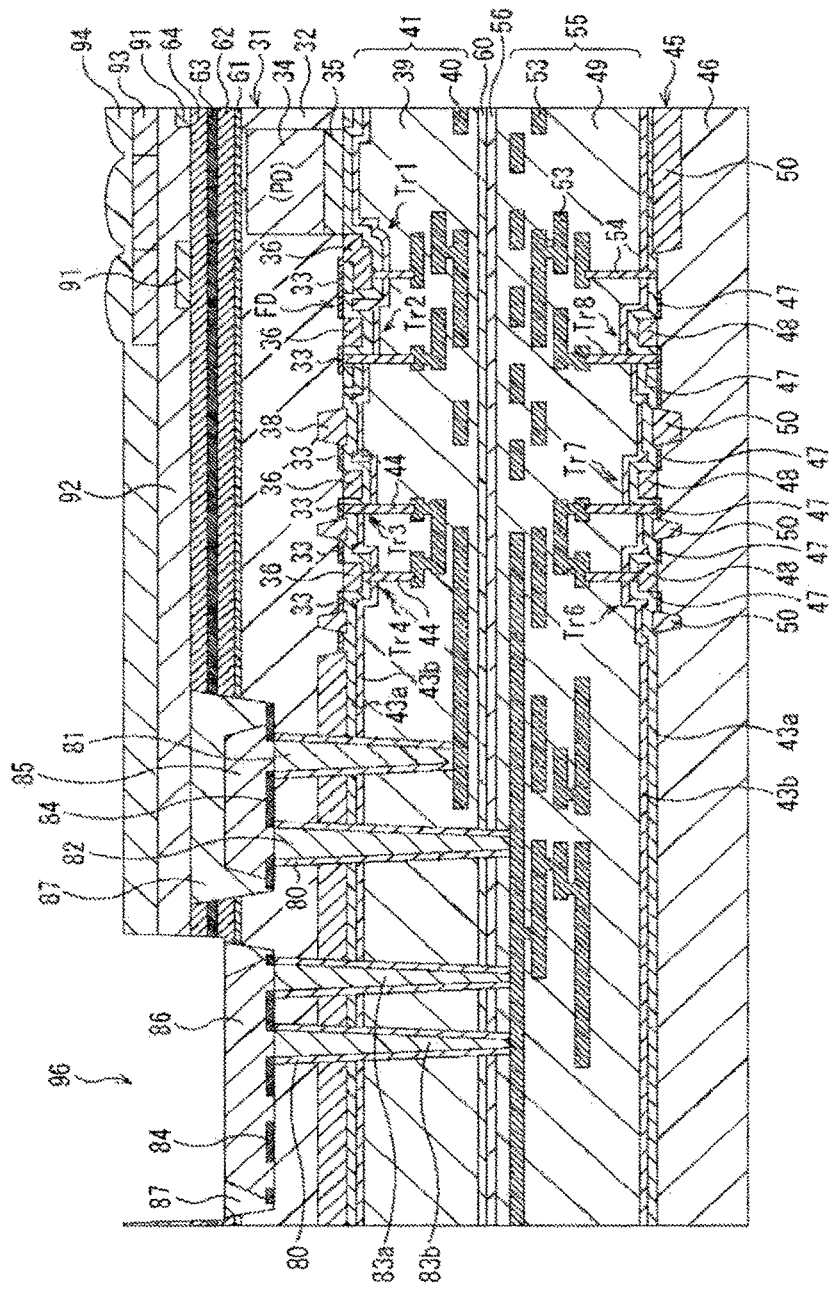
FIG. 25 is a cross-sectional diagram illustrating another configuration example of a solid-state imaging device.

It is noted that although the Al wiring 86 as an electrode pad and the Cu wiring 53 in the second semiconductor substrate 45 are connected via four penetration connecting portions 83a, 83b, 83c, and 83d in the above, the number of penetration connecting portions is not particularly limited as long as it is two or more. For example, two penetration connecting portions 83a and 83b may be provided as illustrated in FIG. 25. Alternatively, the Al wiring 86 and the Cu wiring 53 may be connected through one penetration connecting portion.

Furthermore, although the inter-substrate wiring to electrically connect the first semiconductor substrate 31 to the second semiconductor substrate 45 has a structure including the connecting portion 81, the penetration connecting portions 82, and the Al wiring 85 in the above, other structures may be adopted.

Figure 26:
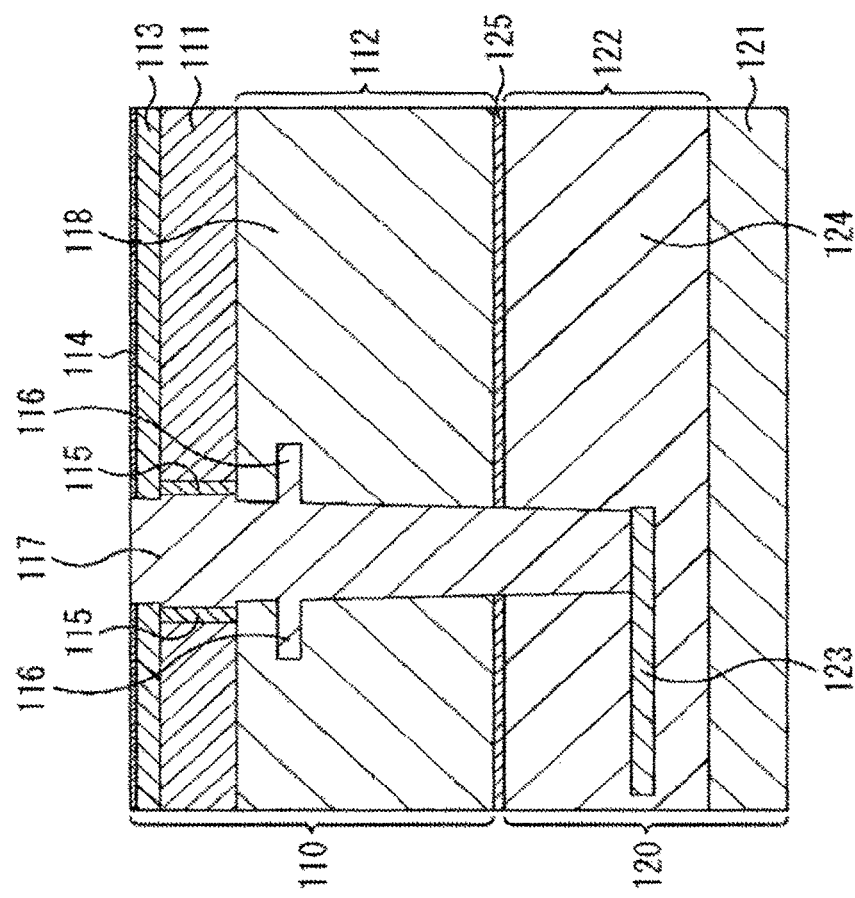
FIG. 26 is a cross-sectional diagram illustrating further another configuration example of a solid-state imaging device.

FIG. 26 is a cross-sectional diagram illustrating a configuration example of a back-surface irradiation type solid-state imaging device including an inter-substrate wiring having another structure.

A solid-state imaging device illustrated in FIG. 26 has a structure in which a first semiconductor substrate 110 having a pixel region and a control circuit and a second semiconductor substrate 120 having a logic circuit are bonded together. The first semiconductor substrate 110 includes a first semiconductor substrate 111 and a wiring layer 112 formed on one surface (front surface) of the first semiconductor substrate 111. The second semiconductor substrate 120 includes a second semiconductor substrate 121 and a wiring layer 122 formed on the second semiconductor substrate 121. The first semiconductor substrate 110 and the second semiconductor substrate 120 are bonded together such that the wiring layers 112 and 122 face each other. A connecting surface 125 is formed on the surfaces of the wiring layers 112 and 122.

The wiring layer 112 of the first semiconductor substrate 111 constitutes a multilayer wiring layer including: a plurality of conductor layers constituting a wiring, an electrode, and the like; and an interlayer insulating layer for insulating between the conductor layers. In the example of FIG. 26, an Al wiring 116 constituted by one of the plurality of conductor layers is illustrated in an interlayer insulating layer 118. On the other surface (back surface) of the first semiconductor substrate 111, there are formed protective layers 113 and 114 constituted by insulating layers. The protective layer 113 covers the whole back surface of the first semiconductor substrate 111 excluding a position where a penetration electrode 117 described later is disposed. The protective layer 114 is disposed on the whole surface covering the protective layer 113 and the exposed surface of the penetration electrode 117.

The wiring layer 122 of the second semiconductor substrate 121 constitutes a multilayer wiring layer including: a plurality of conductor layers constituting a wiring, an electrode, and the like; and an interlayer insulating layer for insulating between the conductor layers. In the example of FIG. 26, a Cu wiring 123 constituted by one of the plurality of conductor layers is illustrated in an interlayer insulating layer 124. The Al wiring 116 and the Cu wiring 123 are each connected with an unillustrated wiring or the like, and connected to various circuit elements such as a MOS transistor.

Furthermore, the solid-state imaging device illustrated in FIG. 26 includes a penetration electrode 117 that penetrates from the back surface of the first semiconductor substrate 111 through the wiring layer 112 and the connecting surface 125 to the Cu wiring 123 of the wiring layer 122. The penetration electrode 117 is formed in an opening that penetrates the protective layer 113, the first semiconductor substrate 111, and the wiring layers 112 and 122. The side surface of the penetration electrode 117 is connected to the inside surface of the opening of the Al wiring 116, and the bottom surface of the penetration electrode 117 is connected to the surface of the Cu wiring 123. In this manner, the penetration electrode 117 as an inter-substrate wiring electrically connects the Al wiring 116 of the wiring layer 112 and the Cu wiring 123.

Furthermore, an insulating layer 115 is disposed at an interface of the first semiconductor substrate 111 which comes into contact with the penetration electrode 117. The penetration electrode 117 penetrates the protective layer 113 on the back surface of the first semiconductor substrate 111, and the edge surface of the penetration electrode 117 is exposed to the surface of the protective layer 113. The protective layer 114 covers the top surface of this penetration electrode 117 and the protective layer 113.

Furthermore, the insulating layer 115 is disposed at an interface of the first semiconductor substrate 111 which comes into contact with the penetration electrode 117, thereby ensuring insulation between the penetration electrode 117 and the first semiconductive substrate 11.

The present technology can also be applied to the solid-state imaging device having the above-described structure.

It is noted that the structure for electrically connecting the first semiconductor substrate and the second semiconductor substrate is not limited to the above-described structure, and further another structure may be provided.

Furthermore, although the Al wiring made of Al is used as the first wiring layer to be formed in the first semiconductor substrate in the above, a Cu wiring made of Cu or a metal wiring made of other metal may be used.

Moreover, although the second semiconductor substrate having a logic circuit described above is configured as a single layer, two or more layers may be provided. That is, the present technology is also applicable to a solid-state imaging device constituted by a laminate including three or more layers with the first semiconductor substrate disposed as the uppermost layer.

The present technology is not limited to the application to a solid-state imaging device, and is also applicable to an imaging device. Here, an imaging device refers to an electronic apparatus having an imaging function, e.g., a camera system such as a digital still camera and a digital video camera, and a mobile phone. It is noted that an imaging device includes a module-like form mounted on an electronic apparatus, that is, a camera module, in some cases.

<Configuration Example of Electronic Apparatus>

Here, a configuration example of an electronic apparatus to which the present technology is applied will be described with reference to FIG. 27.

An electronic apparatus 200 illustrated in FIG. 27 includes an optical lens 201, a shutter device 202, a solid-state imaging device 203, a drive circuit 204, and a signal processing circuit 205. FIG. 27 illustrates an embodiment in which the above-described solid-state imaging device 1 according to the present technology is disposed as the solid-state imaging device 203 to an electronic apparatus (a digital still camera).

Image light (incident light) from an imaging subject forms an image on the imaging surface of the solid-state imaging device 203 through the optical lens 201. Accordingly, signal charges are accumulated in the solid-state imaging device 203 for a certain period of time. The shutter device 202 controls a light illuminating period and a light shielding period to the solid-state imaging device 203.

The drive circuit 204 supplies a drive signal for controlling a signal transfer action of the solid-state imaging device 203 and a shutter action of the shutter device 202. The solid-state imaging device 203 transfers a signal according to the drive signal (a timing signal) supplied from the drive circuit 204. The signal processing circuit 205 performs various signal processing to a signal output from the solid-state imaging device 203. A picture signal having been subjected to signal processing is stored in a storage medium such as a memory, or is output to a monitor.

In the electronic apparatus 200 according to the present embodiment, the solid-state imaging device 203 can achieve the reduced number of steps and enhanced mechanical strength. As a result, there can be provided an electronic apparatus that is inexpensive and highly reliable.

It is noted that an embodiment of the present technology is not limited to the above-described embodiment, and various modifications are possible within the range not departing from the gist of the present technology.

Additionally, the present technology may be configured as below.

(1)

A solid-state imaging device, including: a laminate including a first semiconductor substrate having a pixel region and at least one second semiconductor substrate having a logic circuit, the at least one second semiconductor substrate being bonded to the first semiconductor substrate such that the first semiconductor substrate becomes an uppermost layer; and a penetration connecting portion that penetrates from the first semiconductor substrate into the second semiconductor substrate and connects a first wiring layer formed in the first semiconductor substrate to a second wiring layer formed in the second semiconductor substrate, wherein the first wiring layer is formed with Al or Cu.

(2)

The solid-state imaging device according to (1), wherein the first semiconductor substrate is bonded to the second semiconductor substrate with a back surface of the first semiconductor substrate upward, and wherein the first wiring layer is embedded on the back surface side of the first semiconductor substrate.

(3)

The solid-state imaging device according to (2), further including:

an opening formed such that a top surface of the first wiring layer is exposed, wherein the first wiring layer including the exposed top surface constitutes an electrode pad.

(4)

The solid-state imaging device according to (3), wherein the first wiring layer and the second wiring layer are connected through a plurality of penetration connecting portions.

(5)

The solid-state imaging device according to (3) or (4), wherein the opening is formed outside a pixel region in the first semiconductor substrate.

(6)

The solid-state imaging device according to any of (2) to (5), further including:

a connecting portion that connects the first wiring layer to a third wiring layer formed in a layer below the first wiring layer in the first semiconductor substrate, wherein the connecting portion, the first wiring layer, and the penetration connecting portion constitute an inter-substrate wiring that electrically connects the first semiconductor substrate and the second semiconductor substrate.

(7)

A method of manufacturing a solid-state imaging device, the method including the steps of:

bonding a first semiconductor substrate having a pixel region to at least one second semiconductor substrate having a logic circuit such that the first semiconductor substrate becomes an uppermost layer;

forming a penetration connecting portion that penetrates from the first semiconductor substrate into the second semiconductor substrate and is connected to a second wiring layer formed in the second semiconductor substrate; and forming a first wiring layer with Al or Cu in the first semiconductor substrate, the first wiring layer being connected to the penetration connecting portion.

(8)
An electronic apparatus, including:
a solid-state imaging device including
a laminate including a first semiconductor substrate having a pixel region and at least one second semiconductor substrate having a logic circuit, the at least one second semiconductor substrate being bonded to the first semiconductor substrate such that the first semiconductor substrate becomes an uppermost layer, and
a penetration connecting portion that penetrates from the first semiconductor substrate into the second semiconductor substrate and connects a first wiring layer formed in the first semiconductor substrate to a second wiring layer formed in the second semiconductor substrate,
wherein the first wiring layer is formed with Al or Cu.

REFERENCE SIGNS LIST 1 solid-state imaging device
31 first semiconductor substrate
40 Cu wiring
41 multilayer wiring layer
45 second semiconductor substrate
53 Cu wiring
55 multilayer wiring layer
81 connecting portion
82, 83a to 83d penetration connecting portion
85, 86 Al wiring
96 opening
200 electronic apparatus
203 solid-state imaging device

The invention claimed is:
1. An imaging device, comprising:
a first semiconductor substrate comprising a pixel region including a plurality of photodiodes and a plurality of transistors,
wherein the plurality of transistors includes at least one of a transfer transistor, a reset transistor or an amplification transistor;
a second semiconductor substrate comprising a logic circuit,
wherein the second semiconductor substrate is bonded to the first semiconductor substrate;
a first connecting portion in a first area outside the pixel region,
wherein the first connecting portion extends through the first semiconductor substrate to the second semiconductor substrate, and
wherein the first connecting portion is electrically connected with a first wiring layer in the first semiconductor substrate and a second wiring layer in the second semiconductor substrate; and
a second connecting portion in a second area other than the first area,
wherein the second connecting portion extends through the first semiconductor substrate to the second semiconductor substrate,
wherein the second connecting portion is electrically connected with the second wiring layer,
wherein the second connecting portion is electrically connected to at least one exterior wiring of a plurality of exterior wirings via an electrode pad; and
wherein the electrode pad is above an isolation region in the first semiconductor substrate.

2. The imaging device according to claim 1, wherein the electrode pad is between a first region of the first semiconductor substrate and a second region of the first semiconductor substrate in a cross sectional view.

3. The imaging device according to claim 1,
wherein the first semiconductor substrate is bonded to the second semiconductor substrate with a back surface of the first semiconductor substrate upward, and
wherein the first wiring layer is embedded on a side of the back surface.

4. The imaging device according to claim 1, further comprising:
an opening in the first semiconductor substrate,
wherein a top surface of the first wiring layer is exposed based on the opening in the first semiconductor substrate.

5. The imaging device according to claim 1,
wherein the first wiring layer and the second wiring layer are connected through a plurality of first connecting portions.

6. The imaging device according to claim 1,
wherein the second connecting portion is independent of a connection point connected with the first wiring layer.

7. The imaging device according to claim 1,
wherein the first wiring layer includes a plurality of wirings.

8. The imaging device according to claim 1,
wherein the second wiring layer includes a plurality of wirings.

9. The imaging device according to claim 1,
wherein the second wiring layer includes at least a first portion and a second portion,
wherein the first portion is connected to the first connecting portion, and
wherein the second portion is connected to the second connecting portion.

10. The imaging device according to claim 9,
wherein the first portion and the second portion of the second wiring layer are associated with a same layer.

11. The imaging device according to claim 1,
wherein the first semiconductor substrate includes a silicon substrate, and
wherein at least a part of the electrode pad is above at least a part of the silicon substrate.

12. The imaging device according to claim 1,
wherein an insulating film is included between the electrode pad and the isolation region.

13. An electronic apparatus, comprising:
an imaging device including:
a first semiconductor substrate comprising a pixel region including a plurality of photodiodes and a plurality of transistors,
wherein the plurality of transistors includes at least one of a transfer transistor, a reset transistor or an amplification transistor;
a second semiconductor substrate comprising a logic circuit,
wherein the second semiconductor substrate is bonded to the first semiconductor substrate;
a first connecting portion in a first area outside the pixel region,
wherein the first connecting portion extends through the first semiconductor substrate to the second semiconductor substrate, and
wherein the first connecting portion is electrically connected with a first wiring layer in the first semiconductor substrate and a second wiring layer in the second semiconductor substrate; and a second connecting portion in a second area other than the first area,
wherein the second connecting portion through the first semiconductor substrate to the second semiconductor substrate,
wherein the second connecting portion is electrically connected with the second wiring layer,
wherein the second connecting portion is electrically connected to at least one exterior wiring of a plurality of exterior wirings via an electrode pad; and
wherein the electrode pad is above an isolation region in the first semiconductor substrate.

* * * * *